US012733339B2

(12) United States Patent
Shi et al.

(10) Patent No.: US 12,733,339 B2
(45) Date of Patent: Sep. 8, 2026

(54) DISPLAY SUBSTRATE AND DISPLAY APPARATUS WITH ENHANCED LIGHT TRANSMITTANCE

(71) Applicants: Chengdu BOE Optoelectronics Technology Co., Ltd., Chengdu (CN); BOE Technology Group Co., Ltd., Beijing (CN)

(72) Inventors: Bo Shi, Beijing (CN); Wei Zhang, Beijing (CN); Chi Yu, Beijing (CN); Weiyun Huang, Beijing (CN); Xingliang Xiao, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 773 days.

(21) Appl. No.: 17/788,394

(22) PCT Filed: Sep. 1, 2021

(86) PCT No.: PCT/CN2021/116003
§ 371 (c)(1),
(2) Date: Jun. 23, 2022

(87) PCT Pub. No.: WO2022/088956
PCT Pub. Date: May 5, 2022

(65) Prior Publication Data

US 2023/0032526 A1 Feb. 2, 2023

(30) Foreign Application Priority Data

Oct. 30, 2020 (CN) ......................... 202011199618.7

(51) Int. Cl.
*H10K 59/121* (2023.01)
*H10K 59/122* (2023.01)
(Continued)

(52) U.S. Cl.
CPC ......... *H10K 59/121* (2023.02); *H10K 59/122* (2023.02); *H10K 59/65* (2023.02);
(Continued)

(58) Field of Classification Search
CPC ........................... H10K 59/122; H10K 59/353
See application file for complete search history.

(56) References Cited

U.S. PATENT DOCUMENTS

2019/0393286 A1 12/2019 Liwei et al.
2020/0075697 A1 3/2020 Tong et al.
(Continued)

FOREIGN PATENT DOCUMENTS

CN 107248378 A 10/2017
CN 109801946 A * 5/2019 ........... G06F 3/0412
(Continued)

OTHER PUBLICATIONS

Translation of Chinese Office Action for Chinese Patent Application No. 202011199618.7, issued Mar. 14, 2025, 18 pages.

*Primary Examiner* — Eliseo Ramos Feliciano
*Assistant Examiner* — Timothy Edward Duren
(74) *Attorney, Agent, or Firm* — Westman, Champlin & Koehler, P.A.

(57) ABSTRACT

A display substrate is provided, including: a base substrate; a plurality of first repeating units located in a first display area, each of the first repeating units including a plurality of sub-pixels; and a plurality of second repeating units located in a second display area, each of the second repeating units comprising a plurality of sub-pixels. A distance between two adjacent first repeating units along a first direction is a first pitch, a distance between two adjacent second repeating units along the first direction is a second pitch, and the first pitch is greater than the second pitch. In one of the first repeating units, a distance between two adjacent sub-pixels
(Continued)

along the first direction is a first distance, and the first distance and the second pitch are in a following relationship: 0.15*the second pitch≤the first distance≤0.4*the second pitch.

20 Claims, 19 Drawing Sheets

(51) Int. Cl.
*H10K 59/35* (2023.01)
*H10K 59/65* (2023.01)
*H10K 59/80* (2023.01)

(52) U.S. Cl.
CPC . *H10K 59/80515* (2023.02); *H10K 59/80516* (2023.02); *H10K 59/353* (2023.02)

(56) References Cited

U.S. PATENT DOCUMENTS

| | | | | |
|---|---|---|---|---|
| 2020/0127225 | A1* | 4/2020 | Zhang | H01L 21/77 |
| 2021/0141304 | A1 | 5/2021 | Liu et al. | |
| 2021/0191552 | A1* | 6/2021 | Bok | H10K 59/38 |
| 2022/0093682 | A1 | 3/2022 | Chang et al. | |
| 2022/0093697 | A1* | 3/2022 | Hong | H10K 59/65 |
| 2022/0109039 | A1* | 4/2022 | Jeon | H10K 59/80522 |
| 2022/0123094 | A1 | 4/2022 | Qiu et al. | |
| 2022/0149120 | A1 | 5/2022 | Zhao et al. | |
| 2022/0310712 | A1 | 9/2022 | Zhao et al. | |
| 2022/0310746 | A1 | 9/2022 | Huang et al. | |

FOREIGN PATENT DOCUMENTS

| | | | | | |
|---|---|---|---|---|---|
| CN | 110400535 A | | 11/2019 | |
| CN | 110764362 A | | 2/2020 | |
| CN | 110867480 A | | 3/2020 | |
| CN | 111028678 A | | 4/2020 | |
| CN | 111029391 A | | 4/2020 | |
| CN | 111046599 A | | 4/2020 | |
| CN | 111107193 A | | 5/2020 | |
| CN | 111208648 A | | 5/2020 | |
| CN | 210515985 U | | 5/2020 | |
| CN | 111326560 A | | 6/2020 | |
| CN | 211150599 U | * | 7/2020 | |
| CN | 111682052 A | | 9/2020 | |
| CN | 111725288 A | | 9/2020 | |
| CN | 111916486 B | * | 1/2024 | G09G 3/3225 |
| KR | 2018038112 A | * | 4/2018 | G02B 27/0101 |

* cited by examiner

DISPLAY SUBSTRATE AND DISPLAY APPARATUS WITH ENHANCED LIGHT TRANSMITTANCE

CROSS REFERENCE TO RELATED APPLICATIONS

This application is a Section 371 National Stage Application of International Application No. PCT/CN2021/116003, filed on Sep. 1, 2021, entitled "DISPLAY SUBSTRATE AND DISPLAY APPARATUS", which published as WIPO Publication No. WO 2022/088956 A1, on May 5, 2022, not in English, which claims priority to Chinese Patent Application No. 202011199618.7, filed on Oct. 30, 2020, the disclosures of which are incorporated herein by reference in their entireties.

TECHNICAL FIELD

The present disclosure relates to the field of display technology, and in particular, to a display substrate and a display apparatus.

BACKGROUND

With the increase of users' demands for diversified use of a display apparatus and the emergence of design requirements for a high screen-to-body ratio of the display apparatus, a solution of "under-screen camera" has emerged. In the solution of "under-screen camera", an imaging module such as a camera is embedded in a display area, so as to reduce a size of a frame region of the display apparatus, thereby increasing the screen-to-body ratio. At present, in the solution of "under-screen camera", on the basis of increasing the screen-to-body ratio of the display apparatus, how to ensure a light transmittance and a display effect at a position where an imaging module is disposed in a display substrate has become an important subject for R&D personnel.

The above information disclosed in this section is only used for understanding of the background of the technical concept of the present disclosure, and therefore, the above information may contain information that does not constitute the prior art.

SUMMARY

According to an aspect, there is provided a display substrate including a first display area and a second display area, where the display substrate includes:

a base substrate;

a plurality of first repeating units, arranged on the base substrate in an array along a first direction and a second direction, and located in the first display area, each of the first repeating units including a plurality of sub-pixels that include: a first sub-pixel and a second sub-pixel that are alternately arranged in each of the first direction and the second direction, and a plurality of third sub-pixels arranged in an array along the first direction and the second direction; and a plurality of second repeating units, arranged on the base substrate in an array along the first direction and the second direction, and located in the second display area, each of the second repeating units including a plurality of sub-pixels, where the first repeating unit has a first pitch equal to a distance, along the first direction, between centers of two first sub-pixels that are respectively located in two adjacent first repeating units and are located in a same row;

the second repeating unit has a second pitch equal to a distance, along the first direction, between centers of two first sub-pixels that are respectively located in two adjacent second repeating units and are located in a same row, the first pitch being greater than the second pitch; and within one of the first repeating units, a distance between centers of two adjacent sub-pixels along the first direction is a first distance, and the first distance and the second pitch are in a following relationship: 0.3×the second pitch≤the first distance≤0.8×the second pitch.

According to some exemplary embodiments, in two adjacent first repeating units along the first direction, a distance, along the first direction, between centers of two sub-pixels that are respectively located in the two first repeating units and are adjacent to each other along the first direction is a first spacing, and the first spacing and the second pitch are in a following relationship: 1.2×the second pitch≤the first spacing≤1.7×the second pitch.

According to some exemplary embodiments, the plurality of sub-pixels that are included in the first repeating unit include a first light-emitting device, and the first light-emitting device includes at least an anode structure, where an orthographic projection of the anode structure on the base substrate has a shape of a circle or an oval, or the anode structure includes an anode main body and an anode connection portion, an orthographic projection of the anode main body on the base substrate having a shape of a circle or an oval.

According to some exemplary embodiments, in one of the first repeating units, a distance between centers of two adjacent sub-pixels along the second direction is a second distance, and a ratio of the second distance to the first distance is between 0.8 and 1.2.

According to some exemplary embodiments, in two adjacent first repeating units along the second direction, a distance, along the second direction, between two sub-pixels that are respectively located in two first repeating units and are adjacent to each other along the second direction is a second spacing, and a ratio of the second spacing to the first spacing is between 0.8 and 1.2.

According to some exemplary embodiments, the display substrate further includes a third display area at least partially surrounding the first display area, and the second display area at least partially surrounds the third display area; and the display substrate includes a first pixel driver circuit located in the third display area; and the display substrate further includes at least one first connection line including a first end located in the first display area and a second end located in the third display area, where the first end of the first connection line is electrically connected with the anode structure of the first light-emitting device, and the second end of the first connection line is electrically connected with the first pixel driver circuit.

According to some exemplary embodiments, the first end of the first connection line is electrically connected with the anode structure of the first light-emitting device through a first via hole or a first groove, and an orthographic projection of the anode structure of the first light-emitting device on the base substrate covers an orthographic projection of the first via hole or the first groove on the base substrate.

According to some exemplary embodiments, the display substrate includes a pixel defining layer disposed on the base substrate, where the pixel defining layer has a first opening exposing a part of the anode structure of the first light-emitting device, an orthographic projection of the first opening on the base substrate falls within the orthographic projection of the anode structure of the first light-emitting device on the base substrate, and an area of the orthographic projection of the first opening on the base substrate is smaller than an area of the orthographic projection of the anode structure of the first light-emitting device on the base substrate.

According to some exemplary embodiments, the pixel defining layer includes a first protruding portion, and an orthographic projection of the first protruding portion on the base substrate covers the orthographic projection of the first via hole or the first groove on the base substrate.

According to some exemplary embodiments, an orthographic projection of a combination of the first protruding portion and the first opening on the base substrate has a shape of a circle or an oval, the orthographic projection of the combination of the first protruding portion and the first opening on the base substrate falls within the orthographic projection of the anode structure of the first light-emitting device on the base substrate, and the orthographic projection of the combination of the first protruding portion and the first opening on the base substrate has a same center as the orthographic projection of the anode structure of the first light-emitting device on the base substrate.

According to some exemplary embodiments, the anode structure of the first light-emitting device includes a center portion and a periphery portion surrounding the center portion, at least a part of the periphery portion having a thickness different from a thickness of the center portion.

According to some exemplary embodiments, the periphery portion includes a first part, an orthographic projection of the first part on the base substrate covering the orthographic projection of the first via hole or the first groove on the base substrate, and the first part of the periphery portion having a thickness greater than the thickness of the center portion.

According to some exemplary embodiments, the first distance is in a range of 36.12 microns to 96.32 microns.

According to some exemplary embodiments, the first spacing is in a range of 144.48 microns to 204.68 microns.

According to some exemplary embodiments, one of the first repeating units includes at least one first sub-pixel, at least one second sub-pixel, and at least one third sub-pixel, where the first sub-pixel is configured to emit light of a first color, the second sub-pixel is configured to emit light of a second color, and the third sub-pixel is configured to emit light of a third color, the first color, the second color, and the third color being different from one another; and orthographic projections of anode structures of first light-emitting devices included in the first sub-pixel, the second sub-pixel, and the third sub-pixel on the base substrate have a shape of a circle; or the orthographic projections of the anode structures of the first light-emitting devices included in the first sub-pixel, the second sub-pixel, and the third sub-pixel on the base substrate have a shape of an oval; or orthographic projections of anode structures of first light-emitting devices included in one or more of the first sub-pixel, the second sub-pixel, and the third sub-pixel on the base substrate have a shape of a circle, and orthographic projections of anode structures of first light-emitting devices included in another one or more of the first sub-pixel, the second sub-pixel, and the third sub-pixel on the base substrate have a shape of an oval.

According to some exemplary embodiments, a plurality of sub-pixels included in one of the first repeating units are arranged in an array of 4 rows and 4 columns; in a first row, a first sub-pixel and a third sub-pixel are respectively located in a first column and a second column; in a second row, a third sub-pixel and a second sub-pixel are respectively located in a third column and a fourth column; in a third row, a third sub-pixel and a second sub-pixel are respectively located in the first column and the second column; and in a fourth row, a first sub-pixel and a third sub-pixel are respectively located in the third column and the fourth column.

According to some exemplary embodiments, a plurality of sub-pixels included in one of the first repeating units are arranged in an array of 4 rows and 4 columns; in a first row, a first sub-pixel and a second sub-pixel are respectively located in a first column and a third column; in a second row, two third sub-pixels are respectively located in a second column and a fourth column; in a third row, a second sub-pixel and a first sub-pixel are respectively located in the first column and the third column; and in the fourth row, two third sub-pixels are respectively located in the second column and the fourth column.

According to some exemplary embodiments, an orthographic projection of an anode structure of a first light-emitting device included in the first sub-pixel on the base substrate has a shape of a circle, and an orthographic projection of an anode structure of a first light-emitting device included in each of the second sub-pixel and the third sub-pixel on the base substrate has a shape of an oval; and a long axis of the anode structure of the each of the second sub-pixel and the third sub-pixel substantially extends along the second direction.

According to some exemplary embodiments, each of the plurality of sub-pixels included in the second repeating unit includes a second light-emitting device, and the second light-emitting device includes at least an anode structure; the pixel defining layer further has a second opening exposing at least a part of the anode structure of the second light-emitting device; and an area of an orthographic projection of a first opening in a sub-pixel in the first repeating unit on the base substrate is greater than an area of an orthographic projection of a second opening in a sub-pixel of a same color in the second repeating unit on the base substrate.

According to some exemplary embodiments, a size of an orthographic projection of a first opening in a sub-pixel in the first repeating unit on the base substrate along the first direction is larger than a size of an orthographic projection of a second opening in a sub-pixel of a same color in the second repeating unit on the base substrate along the first direction.

According to some exemplary embodiments, an area of an orthographic projection of an anode structure in a sub-pixel in the first repeating unit on the base substrate is larger than an area of an orthographic projection of an anode structure in a sub-pixel of a same color in the second repeating unit on the base substrate.

According to some exemplary embodiments, in each of the first repeating units, an orthographic projection of a first via hole or a first groove in each sub-pixel on the base substrate is located in a same orientation with respect to a center of an orthographic projection of an anode structure of the sub-pixel on the base substrate.

According to some exemplary embodiments, in each of the first repeating units, first via holes or first grooves in respective sub-pixels located in a same row are located on a same straight line along the first direction.

According to some exemplary embodiments, the display substrate further includes a second pixel driver circuit located in the second display area, an anode structure of a second light-emitting device is electrically connected with the second pixel driver circuit through a second via hole or a second groove; and the anode structure of the second light-emitting device includes an anode connection portion, where an orthographic projection of the anode connection portion on the base substrate covers an orthographic projection of the second via hole or the second groove on the base substrate, and a thickness of a first part of the anode structure of the first light-emitting device is smaller than a thickness of the anode connection portion of the anode structure of the second light-emitting device.

According to some exemplary embodiments, in the first display area, the first connection line is on a side of the anode structure proximate to the base substrate; the display substrate further includes a planarization layer between a layer where the first connection line is located and a layer where the anode structure is located, and the first via hole or the first groove is in the planarization layer; and the anode structure is electrically connected with the first connection line through the first via hole or the first groove.

According to some exemplary embodiments, the first color is red, the second color is blue, and the third color is green.

According to another aspect of the present disclosure, there is provided a display apparatus, including the display substrate described above.

According to some exemplary embodiments, the display apparatus further includes a sensor, where the display substrate has a first side configured to perform displaying, and a second side opposite to the first side, where the first display area allows light from the first side to be at least partially transmitted to the second side, and the sensor is disposed on the second side of the display substrate, and is configured to receive light from the first side.

According to some exemplary embodiments, an orthographic projection of the sensor on the display substrate at least partially overlaps with the first display area.

BRIEF DESCRIPTION OF THE DRAWINGS

The features and advantages of the present disclosure will become more apparent by describing in detail exemplary embodiments of the present disclosure with reference to the accompanying drawings.

DETAILED DESCRIPTION OF EMBODIMENTS

Figure 1:
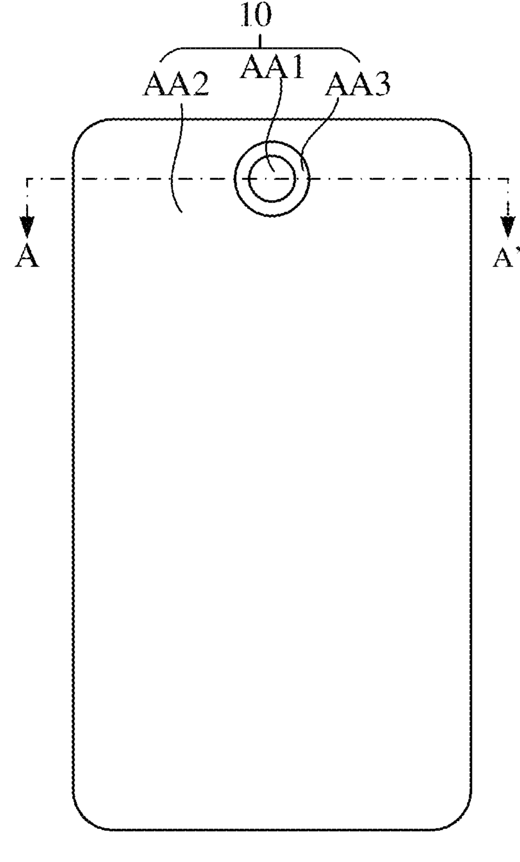
FIG. 1 shows a schematic plan view of a display apparatus according to some exemplary embodiments of the present disclosure, where a plan view of a structure of a display substrate included in the display apparatus is schematically shown.

In order to make the objectives, technical solutions, and benefits of the embodiments of the present disclosure clearer, the technical solutions of the embodiments of the present disclosure will be clearly and completely described below with reference to the accompanying drawings. Obviously, the embodiments described are only some, but not all, of embodiments of the present disclosure. Based on the described embodiments of the present disclosure, all other embodiments obtained by those of ordinary skill in the art without creative work fall within the protection scope of the present disclosure.

It will be noted that in the accompanying drawings, sizes and relative sizes of elements may be exaggerated for purposes of clarity and/or description. As such, sizes and relative sizes of respective elements are not necessarily limited to those shown in the figures. In the description and drawings, the same or similar reference numeral refers to the same or similar component.

When an element is described as being "on", "connected to", or "coupled to" another element, the element may be directly on, directly connected to, or directly coupled to the another element or an intervening element may be present. However, when an element is described as being "directly on", "directly connected to", or "directly coupled to" another element, there is no intervening element. Other terms and/or expressions used to describe a relationship between elements should be interpreted in a similar manner, such as "between . . . and" versus "directly between . . . and", "adjacent" versus "directly adjacent", or "on" versus "directly on". Additionally, the term "connection" may refer to a physical connection, an electrical connection, a communication connection, and/or a fluid connection. Additionally, X, Y, and Z axes are not limited to the three axes of a rectangular coordinate system, and may be interpreted in a broader sense. For example, X, Y, and Z axes may be perpendicular to each other, or may represent different directions that are not perpendicular to each other. For purposes of the present disclosure, "at least one of X, Y, and Z" and "at least one selected from a group consisting of X, Y, and Z" may be interpreted as X only, Y only, Z only, or any combination of two or more of X, Y and Z, such as XYZ, XYY, YZ and ZZ. As used herein, the term "and/or" includes any and all combinations of one or more of related items listed.

It will be noted that terms such as "first" and "second" may be used herein to describe various portions, components, elements, regions, layers and/or parts, however, these portions, components, elements, regions, layers and/or parts should not be limited by these terms. Rather, these terms are used to distinguish one portion, component, element, region, layer or part from another. Thus, for example, a first portion, a first component, a first element, a first region, a first layer, and/or a first part discussed below may be termed a second portion, a second component, a second element, a second region, a second layer, and/or a second part, without departing from the teachings of the present disclosure.

For ease of description, spatial relationship terms, such as "above", "below", "left", "right" and the like, may be used herein to describe a relationship between one element or feature and another element or feature as illustrated in the figures. It will be understood that the spatial relationship terms are intended to encompass different orientations of a device in use or operation in addition to an orientation depicted in the figures. For example, if the device in the figures is turned over, elements described as "below" or "beneath" other elements or features would then be oriented "above" or "over" other elements or features.

In the present disclosure, the expression "repeating unit" refers to a combination of a plurality of sub-pixels, for example, a combination of a plurality of sub-pixels configured to perform displaying of a pixel point, and a plurality of "repeating units" are repeatedly arranged on a base substrate in an array. For example, a repeating unit may include at least one pixel, for example, may include 2, 3, 4, or more sub-pixels. Additionally, in the present disclosure, for ease of description, a repeating unit located in a first display area is referred to as a first repeating unit, and a repeating unit located in a second display area is referred to as a second repeating unit.

In the present disclosure, the expression "pixel density" refers to the number of repeating units or sub-pixels per unit area. Similarly, the expression "distribution density" refers to the number of portions (e.g., repeating units, sub-pixels, and spacers) per unit area.

According to the embodiments of the present disclosure, a display substrate including a first display area and a second display area is provided, where the display substrate includes: a base substrate; a plurality of first repeating units arranged on the base substrate in an array along a first direction and a second direction, and located in the first display area, where each of the first repeating units includes a plurality of sub-pixels; and a plurality of second repeating units arranged on the base substrate in an array along the first direction and the second direction, and located in the second display area, where each of the second repeating units includes a plurality of sub-pixels, and a distance between two adjacent first repeating units along the first direction is a first pitch; a distance between two adjacent second repeating units along the first direction is a second pitch, and the first pitch is greater than the second pitch; and in one of the first repeating units, a distance between two adjacent sub-pixels along the first direction is a first distance, and the first distance and the second pitch are in a relationship as follows: 0.15*the second pitch≤the first distance≤0.4*the second pitch. In this way, in the first display area, an anode structure of the first repeating unit and its corresponding light-emitting structure are clustered compactly, so that light diffraction in the first display area may be reduced and a glare problem may be improved.

Figure 2:
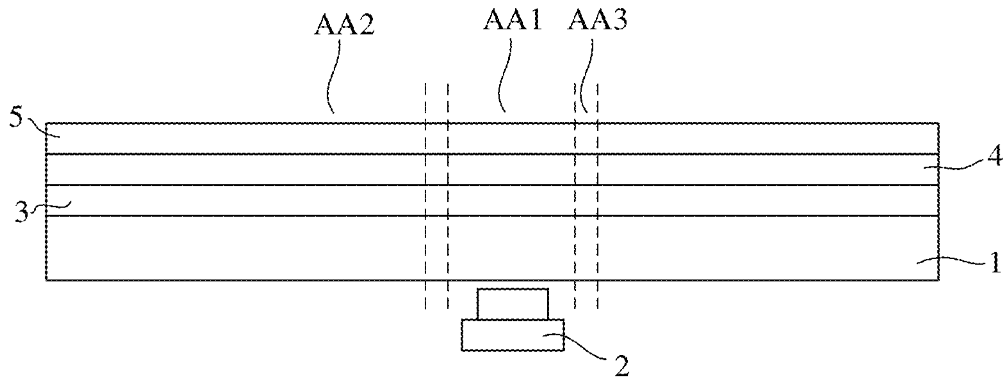
FIG. 2 shows a schematic diagram of a section of the display apparatus taken along a line AA' in FIG. 1 according to some exemplary embodiments of the present disclosure.

FIG. 1 shows a schematic plan view of a display apparatus according to some exemplary embodiments of the present disclosure, where a plan view of a structure of a display substrate included in the display apparatus is schematically shown. FIG. 2 shows a schematic diagram of a section of the display apparatus taken along a line AA' in FIG. 1 according to some exemplary embodiments of the present disclosure.

As shown in FIG. 1, a display apparatus according to an embodiment of the present disclosure includes a display substrate 10. The display substrate 10 includes display areas which may include a first display area AA1, a second display area AA2, and a third display area AA3. For example, the first display area AA1, the second display area AA2, and the second display area AA2 do not overlap with one another. For example, the second display area AA2 at least partially surrounds the third display area AA3 (e.g., the second display area AA2 completely surrounds the third display area AA3), and the third display area AA3 at least partially surrounds the first display area AA1 (e.g., the third display area AA3 completely surrounds the first display area AA1).

Regarding a display substrate with an under-screen sensor (e.g., an image sensor), light-emitting devices in a display area corresponding to the under-screen sensor may have a pixel per inch (PPI) value smaller than that of light-emitting devices in other display areas of the display substrate, so as to improve a light transmittance of the display area of the display substrate corresponding to the under-screen sensor.

As shown in FIG. 2, the display substrate 10 may include a base substrate 1. A sensor 2 may be disposed on a back side of the base substrate 1 (the lower side as shown in FIG. 2, e.g., a side opposite to a side from which the light is emitted when displaying) in the first display area AA1, and the first display area AA1 may have a desired light transmittance for the imaging of the sensor 2.

For example, a light transmittance of the first display area AA1 is greater than a light transmittance of the second display area AA2. The sensor 2 is, for example, an image sensor or an infrared sensor. The sensor 2 is configured to receive light rays from a side for displaying (the upper side in FIG. 2, for example, a light-emitting side when displaying, or a side at which the human eyes are located when displaying) of the display substrate 10, such that an operation such as image capturing, distance perception, and light intensity perception may be performed. For example, these light rays reach the sensor after passing through the first display area AA1, so as to be sensed by the sensor.

It will be noted that, in the illustrated exemplary embodiments, the second display area AA2 completely surrounds the third display area AA3, and the third display area AA3 completely surrounds the first display area AA1, but the embodiments of the present disclosure are not limited to this. For example, in other embodiments, the third display area AA3 may be located at an upper edge of the display substrate. For example, three sides of the third display area AA3 are surrounded by the second display area AA2, and an upper side of the third display area AA3 is flush with an upper side of the display substrate. For another example, the third display area AA3 may be located at the upper edge of the display substrate and extends along the entire width of the display substrate.

For example, the first display area AA1 may have a shape of a circle or an oval, and the second display area AA2 may have a shape of a circle, an oval, or a rectangle, however, the embodiments of the present disclosure are not limited to this. For another example, each of the first display area AA1 and the second display area AA2 may have a shape of a rectangle, a rounded rectangle, or other appropriate shape.

In the display substrate shown in FIG. 1 and FIG. 2, the OLED display technology may be adopted. OLED display substrates are more and more widely used in display products due to advantages of the OLED display substrates, such as wide viewing angle, high contrast ratio, fast response, low power consumption, foldability, flexibility. With the development and further application of the OLED display technology, demand for high screen-to-body ratio displays is growing. In the display substrate shown in FIG. 1 and FIG. 2, a solution of under-screen camera is adopted. In this way, there is no need to provide a notch region, and a formation of hole in a display screen may be avoided, so that the screen-to-body ratio may be increased, and a better visual experience may be achieved.

The display substrate may further include a driver circuit layer, a light-emitting device layer, and an encapsulation layer which are disposed on the base substrate 1. For example, a driver circuit layer 3, a light-emitting device layer 4, and an encapsulation layer 5 are schematically shown in FIG. 2. The driver circuit layer 3 includes a driver circuit structure, and the light-emitting device layer 4 includes a light-emitting device such as an OLED. The driver circuit structure controls a light-emitting device of each sub-pixel to emit light, so as to realize a display function. The driver circuit structure includes a thin film transistor, a storage capacitor, and various signal lines. The various signal lines include a gate line, a data line, an ELVDD power supply line, and an ELVSS power supply line, etc., so as to provide a pixel driver circuit of each sub-pixel with various signals such as a control signal, a data signal, and a power supply voltage.

Figure 3:
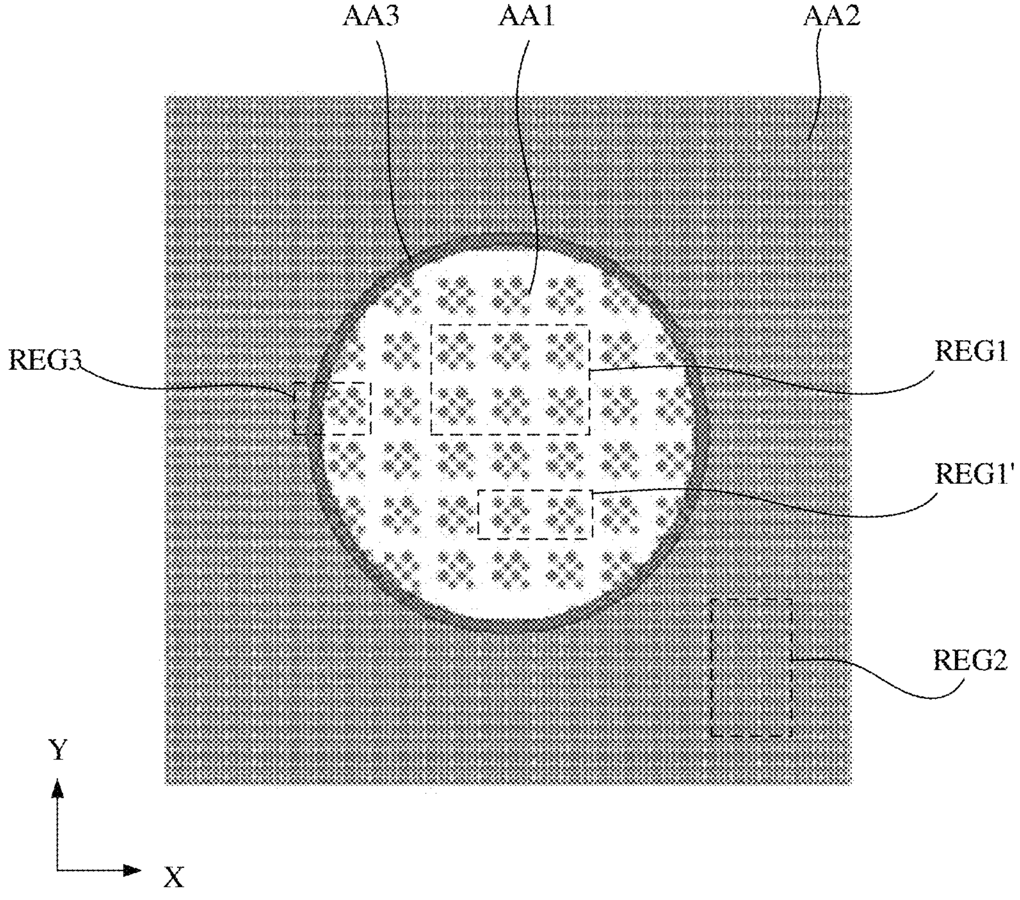
FIG. 3 shows a local schematic diagram of a first display area, a second display area, and a third display area of the display substrate as shown in FIG. 1.
Figure 4:
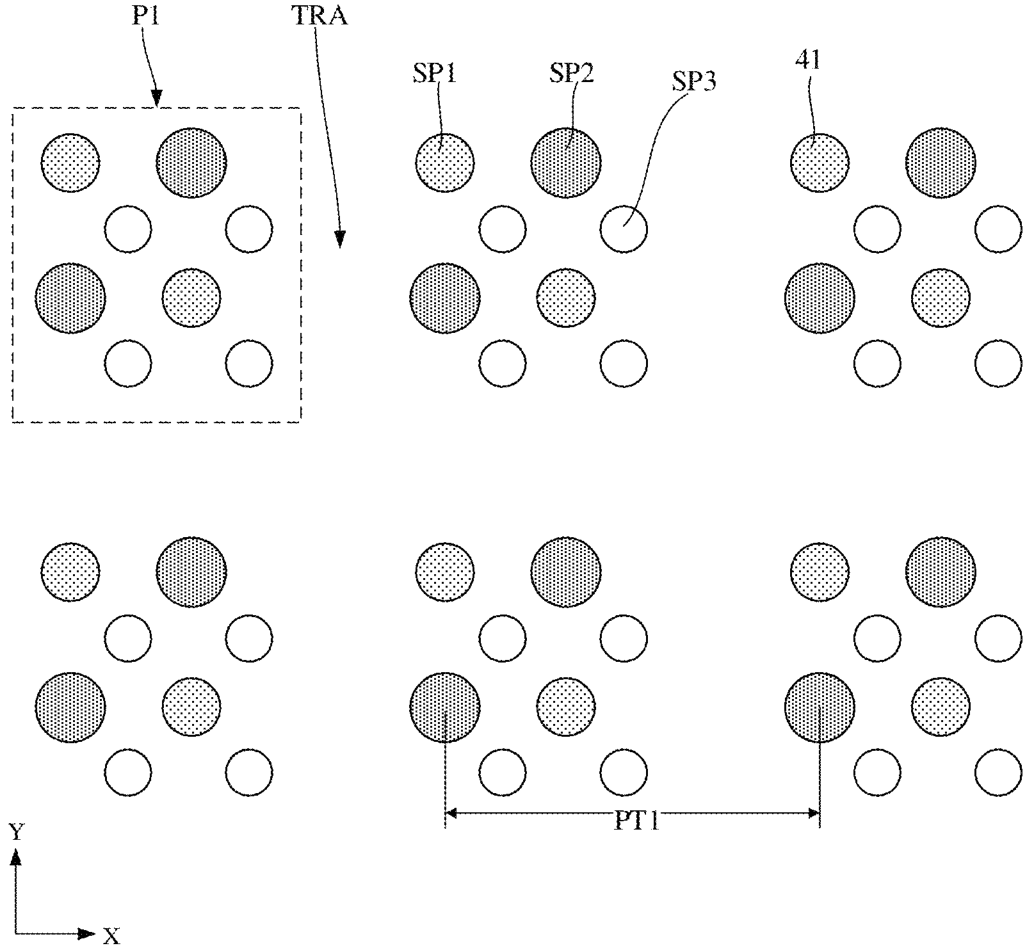
FIG. 4 shows an enlarged view of a local region REG1 in FIG. 3.
Figure 5:
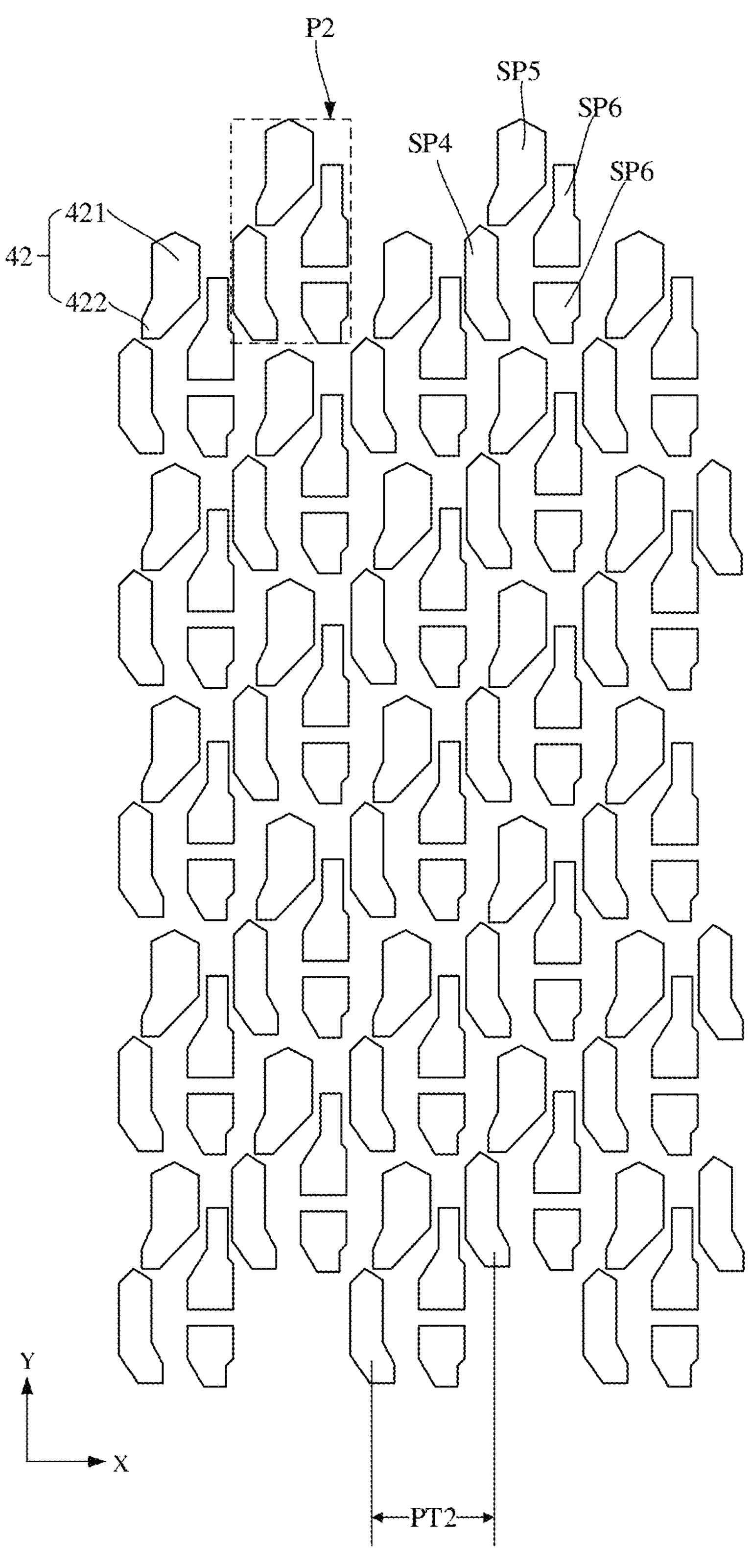
FIG. 5 shows an enlarged view of a local region REG2 in FIG. 3.

FIG. 3 shows a local schematic diagram of a first display area, a second display area, and a third display area of the display substrate as shown in FIG. 1. FIG. 4 shows an enlarged view of a local region REG1 in FIG. 3. FIG. 5 shows an enlarged view of a local region REG2 in FIG. 3.

Referring to FIG. 3 to FIG. 5, the first display area AA1 includes a plurality of first repeating units P1 arranged in an array, and the second display area AA2 includes a plurality of second repeating units P2 arranged in an array. Each of the repeating unit P1 and repeating unit P2 may include a plurality of sub-pixels. In some embodiments, the first repeating unit P1 may further include a plurality of sub-pixels, such as a red sub-pixel, a green sub-pixel, and a blue sub-pixel. Similarly, the second repeating unit P2 may further include a plurality of sub-pixels, such as a red sub-pixel, a green sub-pixel, and a blue sub-pixel.

It will be noted that the red, green and blue pixels are taken as examples in the embodiments of the present disclosure, but the embodiments of the present disclosure are not limited to this. That is, each repeating unit may include at least two sub-pixels of different colors, such as a first color sub-pixel, a second color sub-pixel, and a third color sub-pixel, where the first color, the second color, and the third color are different colors from one another.

For example, in some exemplary embodiments of the present disclosure, a first repeating unit P1 includes at least one (e.g., two as illustrated in FIG. 4) first color sub-pixel, at least one (e.g., two as illustrated in FIG. 4) second color sub-pixel, and at least one (e.g., four as illustrated in FIG. 4) third color sub-pixel. For ease of description, the first color sub-pixel, the second color sub-pixel, and the third color sub-pixel included in the first repeating unit P1 are respectively referred to as a first sub-pixel, a second sub-pixel, and a third sub-pixel, and the first sub-pixel, the second sub-pixel, and the third sub-pixel are respectively denoted by reference numerals SP1, SP2 and, SP3. A second repeating unit P2 includes at least one (e.g., one as illustrated in FIG. 5) first color sub-pixel, at least one (e.g., one as illustrated in FIG. 5) second color sub-pixel, and at least one (e.g., two as illustrated in FIG. 5) third color sub-pixel. For ease of description, the first color sub-pixel, the second color sub-pixel, and the third color sub-pixel included in the second repeating unit P2 are respectively referred to as a fourth sub-pixel, a fifth sub-pixel, and a sixth sub-pixel, and the fourth sub-pixel, the fifth sub-pixel, and the sixth sub-pixel are respectively denoted by reference numerals SP4, SP5, and SP6. For example, the first color may be red, the second color may be blue, and the third color may be green. A sub-pixel may include a light-emitting device, and a pixel driver circuit for driving the light-emitting device to emit light. The light-emitting device may include a first electrode, a second electrode, and a light-emitting material layer between the first electrode and the second electrode. The pixel driver circuit may include elements such as a transistor and a capacitor. The pixel driver circuit is configured to receive a signal from a signal line disposed in the display substrate, so as to generate a current for driving the light-emitting device, and the pixel driver circuit is connected with one of the first electrode and the second electrode, such that the light-emitting device may be driven to emit light. For example, the pixel driver circuit is disposed on the base substrate, and the light-emitting device is located on a side of the pixel driver circuit away from the base substrate. In some embodiments, the display substrate further includes a pixel defining layer disposed on a side of the first electrode away from the pixel driver circuit. The pixel defining layer includes a plurality of openings. Each sub-pixel corresponds to at least one (e.g., one) opening of the pixel defining layer, where an actual light-emitting region or a display region of the sub-pixel is substantially equivalent to a region of an opening of the pixel defining layer corresponding to the sub-pixel. In some embodiments, the opening of the pixel defining layer corresponding to the sub-pixel or the actual light-emitting region corresponding to the sub-pixel has an area smaller than an area of the first electrode, and has a projection on the base substrate completely falling within a projection of the first electrode on the base substrate. For ease of illustration, only general positions and shapes of first electrodes (e.g., an anode structures) of sub-pixels are shown in each of FIG. 4 and FIG. 5, so as to reflect a distribution of the respective sub-pixels.

For example, in some embodiments of the present disclosure, an arrangement of sub-pixels in each repeating unit may refer to a conventional pixel arrangement, such as GGRB, RGBG, and RGB, which is not limited in the embodiments of the present disclosure.

As shown in FIG. 3, the first display area AA1 has a first pixel density, and the second display area AA2 has a second pixel density not smaller than the first pixel density. For example, the second pixel density is greater than the first pixel density. In the first display area AA1, a blank region between a plurality of first repeating units P1 may transmit much light, thereby improving the light transmittance of the first display area AA1. Accordingly, the first display area AA1 has a light transmittance greater than that of the second display area AA2.

It will be noted that, in the present disclosure, the blank region between the plurality of first repeating units P1 may be referred to as a light-transmitting region TRA.

As shown in FIG. 5, each sub-pixel in the second display area AA2 may include a second light-emitting device 42. For example, the second light-emitting device 42 may include an anode structure, a light-emitting material layer, and a cathode structure that are disposed in stack. It will be noted that, for the sake of clarity, the anode structure of the second light-emitting device 42 is used in a related figure to schematically illustrate the second light-emitting device 42, so as to schematically illustrate the sub-pixels in the second display area AA2. For example, in the second display area AA2, the anode structure of the second light-emitting device 42 includes an anode main body 421 and an anode connection portion 422. An orthographic projection of the anode main body 421 on the base substrate 1 may have a regular shape, such as a hexagon. A pixel driver circuit (which will be described below) for driving the second light-emitting device 42 is further provided in the second display area AA2, and the anode connection portion 422 is electrically connected with the pixel driver circuit of the second light-emitting device 42.

For example, in an embodiment as shown in FIG. 5, in the second display area AA2, an orthographic projection of an anode main body 421 of each of the fourth sub-pixel and the fifth sub-pixel on the base substrate 1 may have a regular shape of a hexagon (e.g., a rounded hexagon), and an orthographic projection of an anode main body 421 of the sixth sub-pixel on the base substrate 1 may have a regular shape of a pentagon (e.g., a rounded pentagon). It will be noted that, the shape of the orthographic projection of the anode main body 421 on the base substrate 1 is not limited to the above shapes, and any appropriate shape may be selected, for example, an octagon, a rectangle, a rounded rectangle, or the like.

As shown in FIG. 4, each sub-pixel in the first display area AA1 may include a first light-emitting device 41. For example, the first light-emitting device 41 may include an anode structure, a light-emitting material layer, and a cathode structure that are disposed in stack. It will be noted that, for the sake of clarity, the anode structure of the first light-emitting device 41 is used in FIG. 4 to schematically illustrate the first light-emitting device 41, so as to schematically illustrate the sub-pixel. For example, the first display area AA1 includes a plurality of first light-emitting devices 41 arranged in an array, and the first light-emitting devices 41 are configured to emit light. For example, there is no pixel driver circuit disposed in the first display area AA1, and a pixel driver circuit for driving the first light-emitting device 41 is disposed in the third display area AA3, so as to reduce an area of a metal coverage in the first display area AA1 and increase the light transmittance of the first display area AA1. As such, the light transmittance of the first display area AA1 may be greater than the light transmittance of the second display area AA2.

For example, in an embodiment as shown in FIG. 4, in the first display area AA1, an orthographic projection of an anode structure of each of the first sub-pixel, the second sub-pixel, and the third sub-pixel on the base substrate 1 may be substantially circular or oval. In this way, the area of a light-emitting region of a light-emitting device of each sub-pixel in the first display area AA1 may be increased, thereby improving a service life of the light-emitting device of the sub-pixel in the first display area AA1.

It will be understood that the anode structure of the first light-emitting device 41 may include an anode main body and an anode connection portion. An orthographic projection of the anode main body on the base substrate 1 may be substantially circular or oval. The anode connection portion of the first light-emitting device 41 may be electrically connected with a first end (which will be described below) of a first connection line 110, so that the first light-emitting device 41 is electrically connected with the pixel driver circuit of the first light-emitting device 41.

As shown in FIG. 3 to FIG. 5, each of a plurality of first repeating units P1 and a plurality of second repeating units P2 is arranged in an array on the base substrate 1 of the display substrate 10. For example, the plurality of first repeating units P1 are arranged in an array along a first direction (an X direction shown in the figures) and a second direction (a Y direction shown in the figures) in the first display area AA1. The plurality of second repeating units P2 are arranged in an array along the first direction (the X direction shown in the figures) and the second direction (the Y direction shown in the figures) in the second display area AA2.

A distance between adjacent first repeating units P1 in the first direction X may be referred to as a pitch of the first repeating unit P1 or a pitch in the first display area AA1, which is denoted by a reference numeral PT1 as shown in the figures. For example, the pitch of the first repeating unit P1 or the pitch in the first display area AA1 is a distance, along the first direction X, between centers of two first color sub-pixels which are respectively located in two adjacent first repeating units P1 and are located in a same row, or a distance, along the first direction X, between centers of two second color sub-pixels which are respectively located in two adjacent first repeating units P1 and are located in a same row. A distance between adjacent second repeating units P2 in the first direction X may be referred to as a pitch of the second repeating unit P2 or a pitch in the second display area AA2, which is denoted by a reference numeral PT2 as shown in the figures. For example, the pitch of the second repeating unit P2 or the pitch in the second display area AA2 is a distance, along the first direction X, between centers of two most adjacent first color sub-pixels, or between centers of two most adjacent second color sub-pixels.

For example, referring to FIG. 4, the first repeating unit P1 may include a plurality of sub-pixels arranged in 4 rows and 4 columns. In a first row, a first sub-pixel SP1 and a second sub-pixel SP2 are respectively disposed in a first column and a third column. In a second row, two third sub-pixels SP3 are respectively disposed in a second column and a fourth column. In a third row, a second sub-pixel SP2 and a first sub-pixel SP1 are respectively disposed in the first column and the third column. In a fourth row, two third sub-pixels SP3 are respectively disposed in the second column and the fourth column.

It will be noted that, in the embodiments of the present disclosure, the first direction X may be referred to as a row direction, and the second direction Y may be referred to as a column direction.

Figure 8:
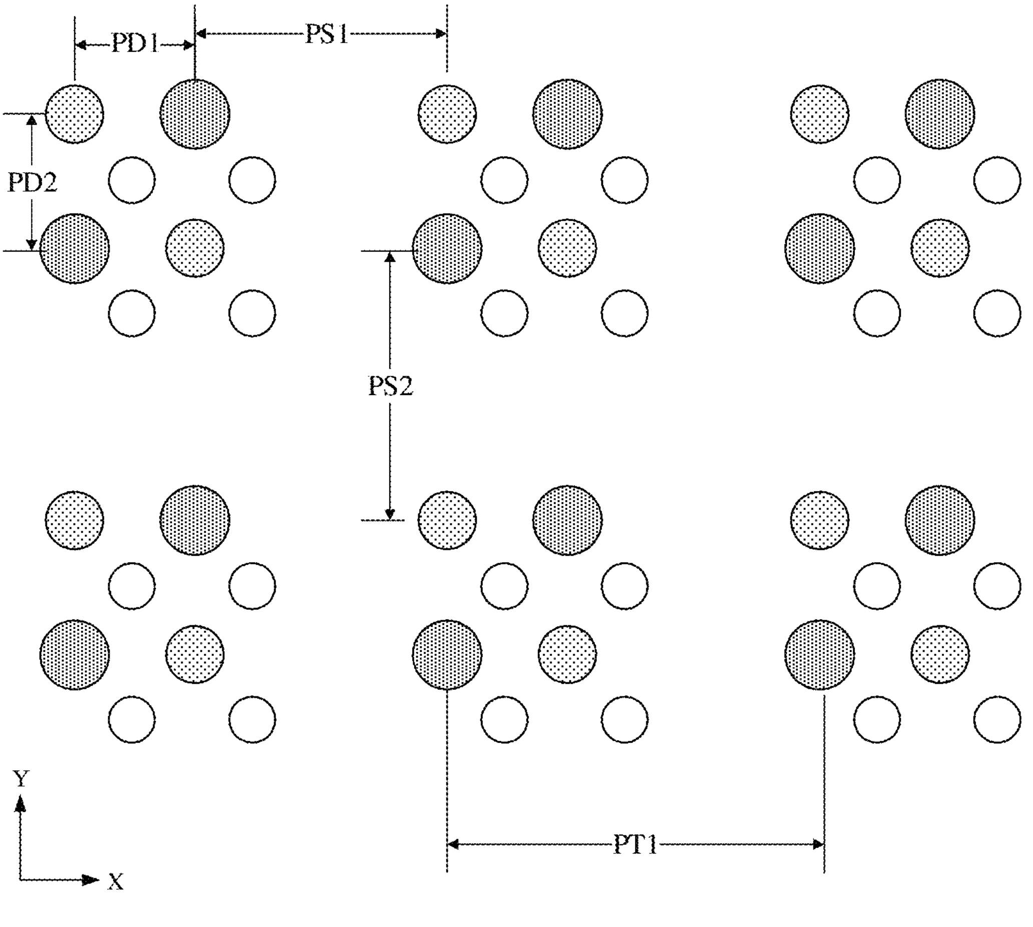
FIG. 8 shows an enlarged view of the local region REG1 in FIG. 3, where a distance between sub-pixels in a first repeating unit and a pitch between first repeating units are schematically shown.

FIG. 8 shows an enlarged view of the local region REG1 in FIG. 3, where a distance between sub-pixels in a first repeating unit and a pitch between first repeating units are schematically shown.

For example, as shown in FIG. 8, a distance, along the first direction X, between two sub-pixels of a same color which are respectively located in two adjacent first repeating units P1 and are located in a same row may represent the above first pitch PT1. It will be noted that, in the embodiment as shown in FIG. 8, the "two sub-pixels of a same color" here may include a case of "two first color sub-pixels" or a case of "two second color sub-pixels". Additionally, in the embodiment as shown in FIG. 8, four third color sub-pixels are respectively located in two adjacent first repeating units P1 and are located in a same row, and "two sub-pixels of a same color" does not include a case of "two third color sub-pixels".

For example, as shown in FIG. 5, a distance, along the first direction X, between two sub-pixels of a same color which are respectively located in two adjacent second repeating units P2 may represent the above second pitch PT2.

In some embodiments of the present disclosure, the first pitch PT1 is greater than the second pitch PT2. That is, a spacing between the first repeating units P1 is increased. In this way, a distribution density of the first repeating units P1 in the first display area AA1 is smaller than a distribution density of the second repeating units P2 in the second display area AA2.

Within a first repeating unit P1, a distance between two adjacent sub-pixels located in the same row may be referred to as a first distance, and may be denoted by a reference numeral PD1. For example, as shown in FIG. 8, in the first repeating unit P1 on the upper left side, a distance between the first sub-pixel SP1 and the second sub-pixel SP2 which are located in the first row may represent the above first distance PD1.

Within a first repeating unit P1, a distance between two adjacent sub-pixels located in the same column may be referred to as a second distance, and may be denoted by a reference numeral PD2. For example, as shown in FIG. 8, in the first repeating unit P1 on the upper left side, a distance between the first sub-pixel SP1 and the second sub-pixel SP2 which are located in the first column may represent the above second distance PD2.

For example, the first distance PD1 may be substantially equal to the second distance PD2. In some embodiments, the first distance PD1 and the second pitch PT2 may be in a following relationship: 0.3*PT2≤PD1≤0.8*PT2. For example, PD1 may be substantially equal to 0.65*PT2. In this way, within the first repeating units P1, the respective sub-pixels are clustered compactly.

For example, in some embodiments, the second pitch PT2 may be substantially equal to about 102 microns, and the first distance PD1 may be in a range of 30.6 microns to 81.6 microns, for example, in a range of about 70 microns to 80 microns, such as about 78 microns.

In two first repeating units P1 adjacent to each other along the first direction X, a distance between two sub-pixels which are respectively located in the two first repeating units P1 and are adjacent to each other in the first direction X may be referred to as a first spacing, and may be denoted by a reference numeral PS1. For example, as shown in FIG. 8, in two adjacent first repeating units P1 along the first direction X, a distance between a second sub-pixel SP2 located in a first column of a first repeating unit P1 and a first sub-pixel SP1 located in a first column of another first repeating unit P1 may represent the above first spacing PS1.

In two adjacent first repeating units P1 along the second direction Y, a distance between two sub-pixels which are respectively located in the two first repeating units P1 and are adjacent to each other in the second direction Y may be referred to as a second spacing, and may be denoted by a reference numeral PS2. For example, as shown in FIG. 8, in two adjacent first repeating units P1 along the second direction Y, a distance between a second sub-pixel SP2 located in a first column of a first repeating unit P1 and a first sub-pixel SP1 located in a first column of another first repeating unit may represent the above second spacing PS2.

For example, the first spacing PS1 may be substantially equal to the second spacing PS2. In some embodiments, the first spacing PS1 and the second pitch PT2 may be in the following relationship: 1.2*PT2≤PS1≤1.7*PT2. For example, PS1 may be substantially equal to 1.35*PT2. In this way, a distance between the respective first repeating units P1 in the first display area AA1 is increased.

For example, in some embodiments, the first spacing PS1 may be in a range of 1228 microns to 175 microns, e.g., in a range of about 155 microns to 165 microns, such as about 162 microns.

It will be noted that, in the embodiments of the present disclosure, a distance between sub-pixels may be represented by a distance between centers of openings of the pixel defining layer corresponding to the respective sub-pixels, or a distance between centers of anode structures of the respective sub-pixels. For example, in embodiments as shown in FIG. 4 and FIG. 8, the respective circles may represent shapes of orthographic projections of anode structures of the respective sub-pixels on the base substrate. A center of each sub-pixel may be a center of a circle, and a distance between the sub-pixels may be represented by a distance between the centers of the circles of the sub-pixels.

Figure 6:
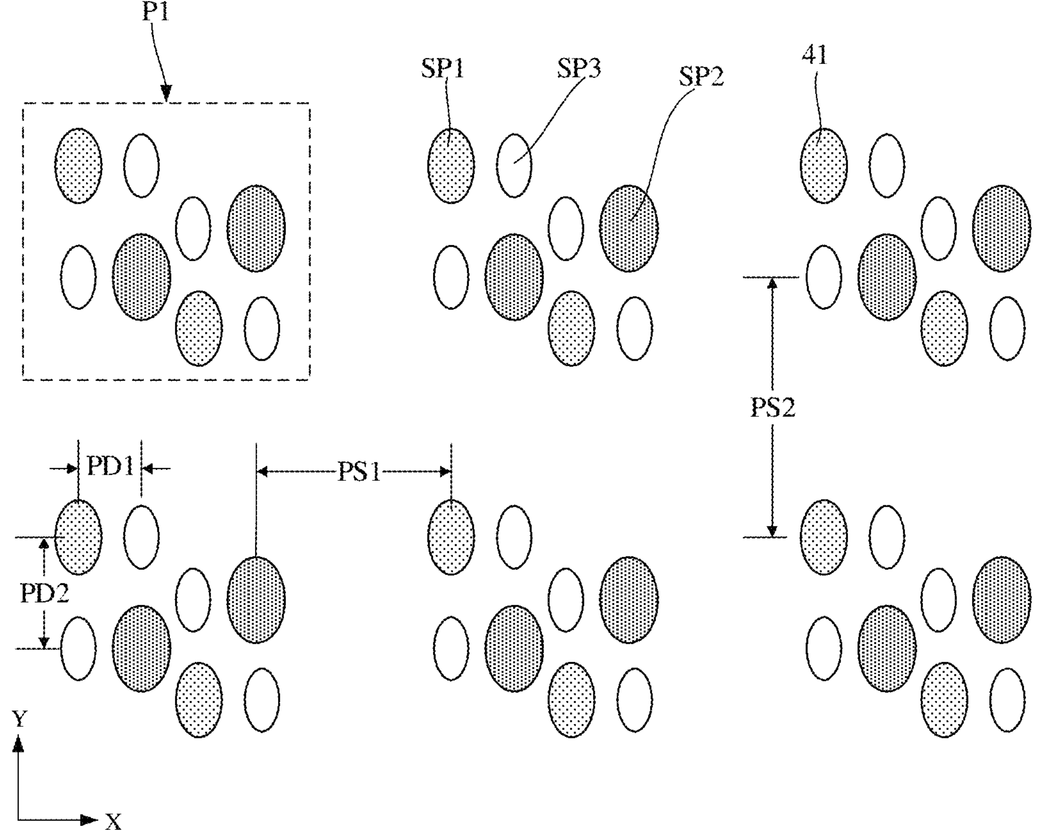
FIG. 6 and FIG. 7 respectively show enlarged views of the local region REG1 in FIG. 3 according to some embodiments of the present disclosure.
Figure 7:
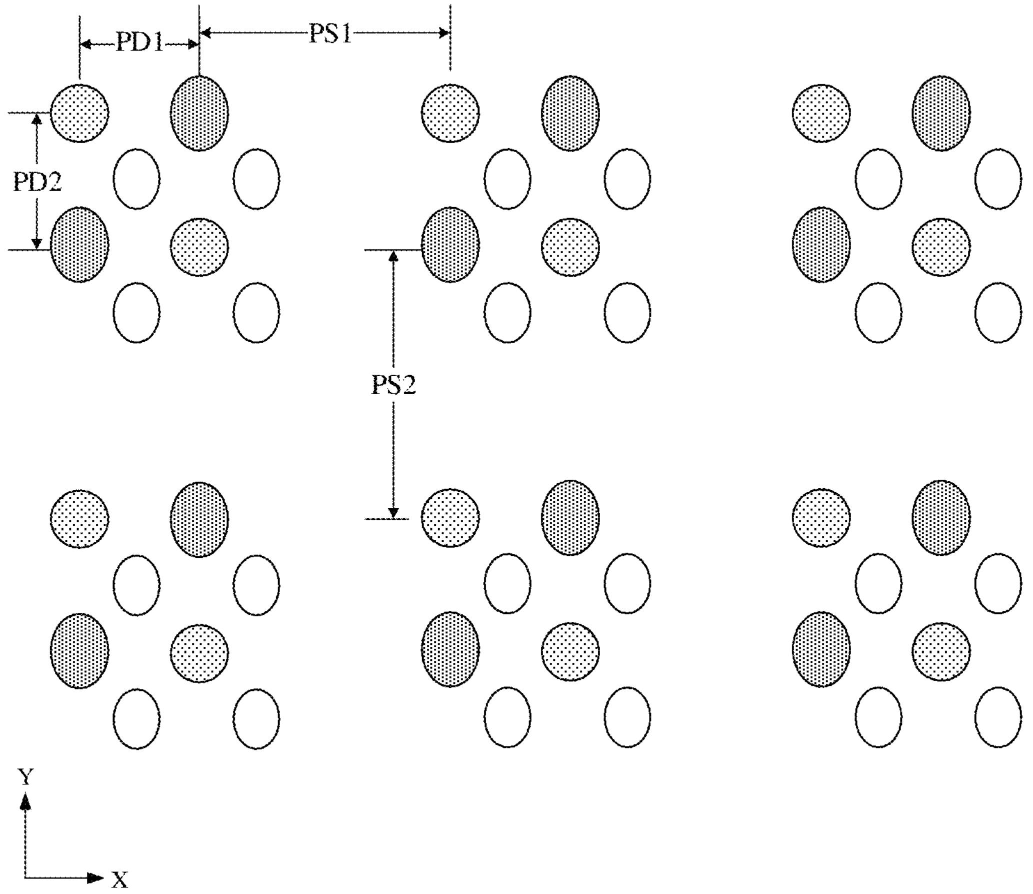

FIG. 6 and FIG. 7 respectively show enlarged views of the local region REG1 in FIG. 3 according to some embodiments of the present disclosure.

For example, in an embodiment of FIG. 6, in the first display area AA1, an orthographic projection of an anode structure of each of the first sub-pixel, the second sub-pixel, and the third sub-pixel on the base substrate 1 may have a shape of an oval. In this way, the area of the light-emitting region of the light-emitting device of each sub-pixel in the first display area AA1 may be increased, thereby improving the service life of the light-emitting device of each sub-pixel in the first display area AA1.

Referring to FIG. 6, a long axis of an (oval) anode structure of each of the first sub-pixel, the second sub-pixel, and the third sub-pixel substantially extends along the second direction Y.

The First repeating unit P1 may include a plurality of sub-pixels arranged in an array of 4 rows and 4 columns. In a first row, a first sub-pixel SP1 and a third sub-pixel SP3 are respectively disposed in a first column and a second column. In a second row, a third sub-pixel SP3 and a second sub-pixel SP2 are respectively disposed in a third column and a fourth column. In a third row, a third sub-pixel SP3 and a second sub-pixel SP2 are respectively disposed in the first column and the second column. In a fourth row, a first sub-pixel SP1 and a third sub-pixel SP3 are respectively disposed in the third column and the fourth column.

With such an arrangement, sub-pixels in the first repeating units P1 may be closely arranged, thereby achieving compact clustering of the respective sub-pixels within the first repeating unit P1.

Likewise, in this embodiment, the first distance PD1 may be substantially equal to the second distance PD2. In some embodiments, the first distance PD1 and the second pitch PT2 may be in the following relationship: 0.3*PT2≤PD1≤0.8*PT2. For example, PD1 may be substantially equal to 0.65*PT2. In this way, within the first repeating units P1, the sub-pixels are clustered compactly.

The first spacing PS1 may be substantially equal to the second spacing PS2. In some embodiments, the first spacing PS1 and the second pitch PT2 may be in the following relationship: 1.2*PT2≤PS1≤1.7*PT2. For example, PS1 may be substantially equal to 1.35*PT2. In this way, a distance between the respective first repeating units P1 in the first display area AA1 is increased.

For example, in the embodiment of FIG. 7, in the first display area AA1, the orthographic projection of the anode structure of the first sub-pixel on the base substrate 1 may have a shape of a circle, and the orthographic projection of the anode structure of each of the second sub-pixel and the third sub-pixel on the base substrate 1 may have a shape of an oval. In this way, the area of the light-emitting region of the light-emitting device of each sub-pixel in the first display area AA1 may be increased, thereby improving the service life of the light-emitting device of each sub-pixel in the first display area AA1.

A long axis of an (oval) anode structure of each of the second sub-pixel and the third sub-pixel extends substantially along the second direction Y.

The first repeating units P1 may include a plurality of sub-pixels arranged in 4 rows and 4 columns. In a first row, a first sub-pixel SP1 and a second sub-pixel SP2 are respectively disposed in a first column and a third column. In a second row, two third sub-pixels SP3 are respectively disposed in a second column and a fourth column. In a third row, a second sub-pixel SP2 and a first sub-pixel SP1 are respectively disposed in the first column and the third column. In a fourth row, two third sub-pixels SP3 are respectively disposed in the second column and the fourth column.

With such an arrangement, sub-pixels in the first repeating units P1 may be closely arranged, thereby achieving a compact clustering of the respective sub-pixels in the first repeating units P1.

Likewise, in this embodiment, the first distance PD1 may be substantially equal to the second distance PD2. In some embodiments, the first distance PD1 and the second pitch PT2 may be in the following relationship: 0.3*PT2≤PD1≤0.8*PT2. For example, PD1 may be substantially equal to 0.65*PT2. In this way, within the first repeating units P1, the sub-pixels are clustered compactly.

The first spacing PS1 may be substantially equal to the second spacing PS2. In some embodiments, the first pitch PS1 and the second pitch PT2 may be in the following relationship: 1.2*PT2≤PS1≤1.7*PT2. For example, PS1 may be substantially equal to 1.35*PT2. In this way, a distance between the respective first repeating units P1 in the first display area AA1 is increased.

It will be noted that, in the embodiments of the present disclosure, a distance between sub-pixels may be represented by a distance between centers of openings of pixel defining layers corresponding to the respective sub-pixels, or a distance between centers of anode structures of the respective sub-pixels. For example, in the embodiments shown in FIG. 6 and FIG. 7, the respective circles or ovals may represent shapes of orthographic projections of anode structures of the respective sub-pixels on the base substrate. A center of each sub-pixel may be a center of a circle or a center of an oval, and a distance between the sub-pixels may be represented by a distance between the centers of the circles or the centers of the ovals of the sub-pixels.

In the embodiments of the present disclosure, in the first display area AA1, the orthographic projection of the anode structure of each of the first sub-pixel, the second sub-pixel, and the third sub-pixel on the base substrate 1 may have a shape of a circle or an oval. FIG. 4, FIG. 6 and FIG. 7 only illustrate several examples, the embodiments of the present disclosure are not limited to these examples, and other combinations of circles and ovals are also applicable to the embodiments of the present disclosure. For example, in some embodiments, the second sub-pixel SP2 may have shapes of circle, and the first sub-pixel SP1 and the third sub-pixel SP3 may have shape of an oval; in some embodiments, the third sub-pixel SP3 may be circular, and the first sub-pixel SP1 and the second sub-pixel SP2 may be oval; in some embodiments, the first sub-pixel SP1 may be oval, and the second sub-pixel SP2 and the third sub-pixel SP3 may be circular; in some embodiments, the second sub-pixel SP2 may be oval, and the first sub-pixel SP1 and the third sub-pixel SP3 may be circular; and in some embodiments, the third sub-pixel SP3 may be oval, and the first sub-pixel SP1 and the second sub-pixel SP2 may be circular.

Additionally, in the embodiments as shown FIG. 6 and FIG. 7, the long axis of the oval extends along the second direction Y, but the embodiments of the present disclosure are not limited to this. In some embodiments, the long axis of the oval may extend along the first direction X.

Figure 9:
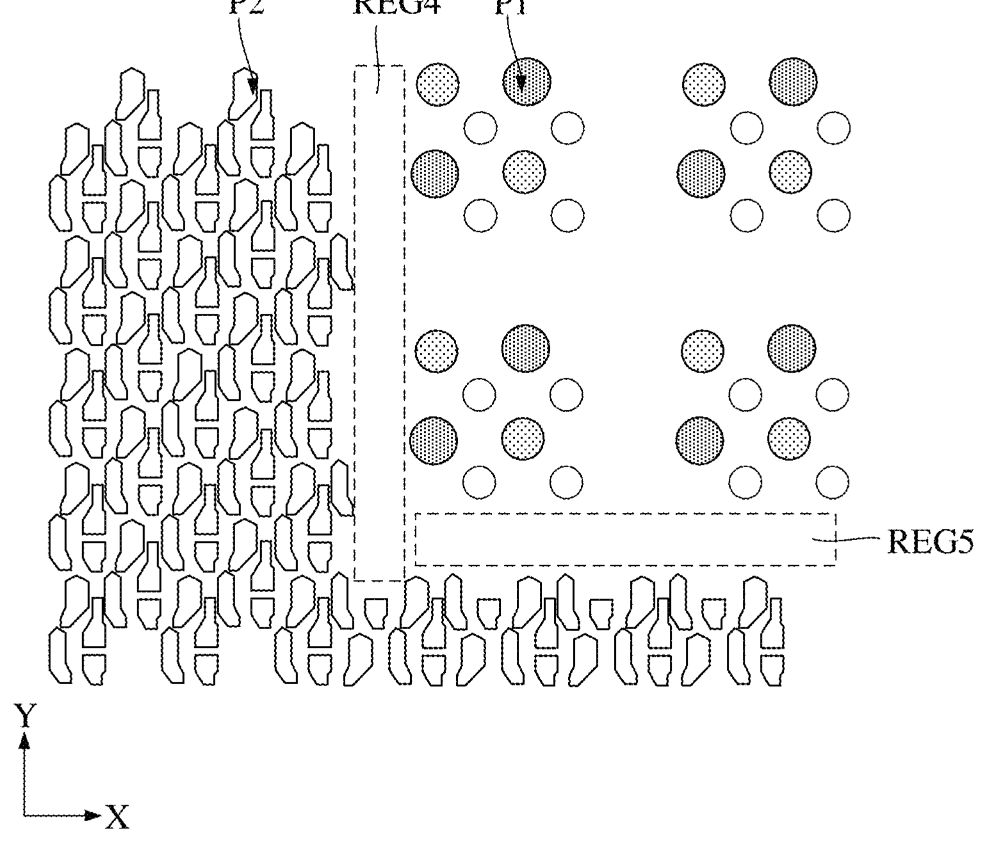
FIG. 9 shows an enlarged view of a local region REG3 in FIG. 3, where a transition region between the first repeating unit and the second repeating unit is schematically shown.

FIG. 9 shows an enlarged view of a local region REG3 in FIG. 3, where a transition region between the first repeating unit and the second repeating unit is schematically shown. As shown in FIG. 9, along the first direction X, there is a gap REG4 between a boundary of the first repeating unit P1 located in the first display area AA1 and a boundary of the second repeating unit P2 located in the second display area AA2. Along the second direction Y, there is a gap REG5 between a boundary of the first repeating unit P1 located in the first display area AA1 and a boundary of the second repeating unit P2 located in the second display area AA2. It will be understood that sizes of the gap REG4 and the gap REG5 may be determined according to factors such as a size of the sensor 2 to be disposed and a size of the first repeating unit P1.

In the embodiments of the present disclosure, in the first display area AA1, the anode structure of the first repeating unit as well as a corresponding light-emitting structure of the anode structure are clustered compactly, and accordingly, the spacing between the first repeating units is increased, so that diffraction of light in the first display area may be reduced, thereby improving a glare problem. Additionally, the anode structure of the first repeating unit and its corresponding light-emitting structure are set to be an oval or a circle, so that light diffraction in the first display area may be further reduced, thereby improving the glare problem.

Figure 10:
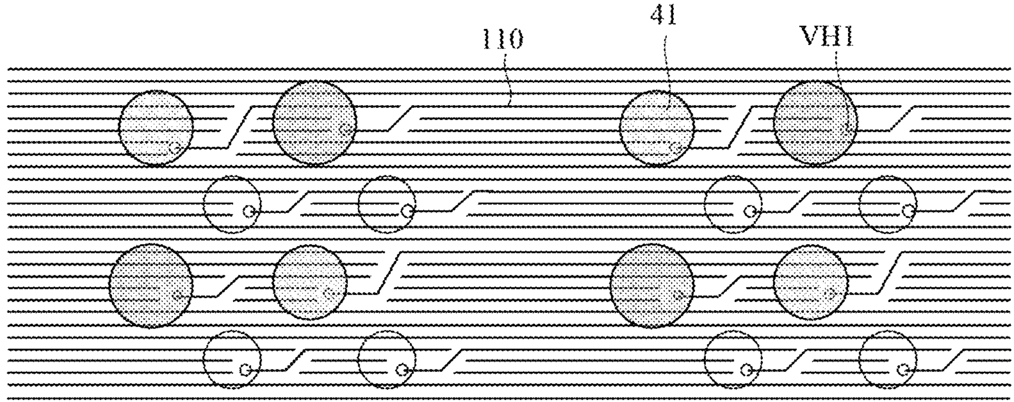
FIG. 10 shows an enlarged view of a local region REG1' in FIG. 3, where a wire for electrically connecting each sub-pixel in the first display area AA1 to a pixel driver circuit of the sub-pixel is schematically shown.
Figure 11:
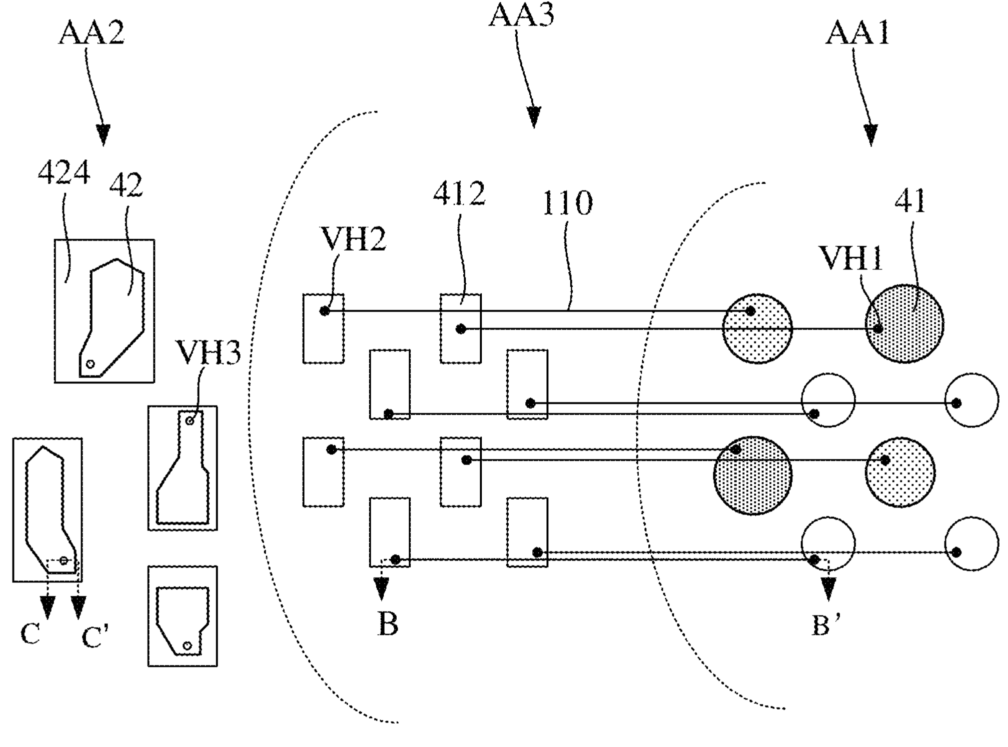
FIG. 11 shows an enlarged view of the local region REG3 in FIG. 3.

FIG. 10 shows an enlarged view of a local region REG1' in FIG. 3, where a wire for electrically connecting each sub-pixel in the first display area AA1 to a pixel driver circuit of the sub-pixel is schematically shown. FIG. 11 shows an enlarged view of the local region REG3 in FIG. 3.

FIG. 11 only shows an enlarged view of a region including a column of first pixel driver circuits, a column of first light-emitting devices, a column of second pixel driver circuits, and a column of second light-emitting devices. It will be noted that, in order to clearly reflect a connection between a first pixel driving circuit and a first light-emitting device, FIG. 11 shows that a first pixel driver circuit and a first light-emitting device that are adjacent are connected to each other. However, according to FIG. 3, FIG. 10, and FIG. 11, it may be understood that in FIG. 11, other first light-emitting devices not shown may be further disposed on the left side of the first light-emitting devices, and other first pixel driver circuits not shown may be further disposed on the right side of the first pixel driver circuits.

It will be noted that, herein, for ease of description, a light-emitting device located in the first display area AA1 is referred to as the first light-emitting device, and correspondingly, a circuit for driving the first light-emitting device to emit light is referred to as the first pixel driver circuit. A light-emitting device disposed in the second display area AA2 is referred to as the second light-emitting device, and correspondingly, a circuit for driving the second light-emitting device to emit light is referred to as the second pixel driver circuit.

For example, as shown in FIG. 11, the third display area AA3 includes at least one (e.g., a plurality of) first pixel driver circuits 412. For example, the first light-emitting devices 41 are electrically connected with the first pixel driver circuits 412 in a one-to-one correspondence, and the plurality of first pixel driver circuits 412 are configured to drive a plurality of first light-emitting devices 41 in a one-to-one correspondence. For example, a rectangular box shown in FIG. 11 (a region having a black border and white fill, indicated by a reference numeral 412) represents the first pixel driver circuits 412. For example, the first pixel driver circuits 412 are configured to drive the plurality of first light-emitting devices 41 to emit light in a one-to-one correspondence. That is, one first pixel driver circuit 412 drives one corresponding first light-emitting device 41, and different first pixel driver circuits 412 drive different first light-emitting devices 41.

In the embodiments of the present disclosure, the pixel driver circuits for driving the respective sub-pixels of the first display area AA1 are located in the third display area AA3, rather than arranging in the first display area AA1. For example, an anode structure of a first light-emitting device 41 is electrically connected with a first end of a first connection line 110 through a via hole. An orthographic projection of the first light-emitting device 41 on the base substrate 1 is arranged spaced apart from an orthographic projection of the first pixel driver circuit 412 on the base substrate 1. In this way, a coverage area of a metal or opaque pattern within the first display area AA1 is reduced, and the transmittance of the first display area AA1 is increased, so that the light transmittance of the first display area AA1 is greater than that of the second display area AA2.

For example, as shown in FIG. 11, the display substrate further includes a plurality of first connection lines 110 disposed on the base substrate 1. A first connection line 110 includes a first end within the first display area 11 and a second end within the third display area AA3. That is, the first connection line 110 extends from the first display area 11 to the third display area AA3.

The first end of the first connection line 110 is electrically connected with an anode structure of a first light-emitting device 41 of a sub-pixel, the second end of the first connection line 110 is electrically connected with s first pixel driver circuit 412, and the first connection line 110 is configured to transmit an electrical signal provided by the first pixel driver circuit 412 to the anode structure of the first light-emitting device 41, so as to drive the first light-emitting device 41 to emit light.

As shown in FIG. 11, the second display area AA2 further includes at least one (e.g., a plurality of) second light-emitting devices 42 and at least one (e.g., a plurality of) second pixel driver circuits 424. The second light-emitting devices 42 are electrically connected with the second pixel driver circuits 424 in a one-to-one correspondence, and the second pixel driver circuits 424 are configured to drive the second light-emitting devices 42 to emit light.

It will be noted that, in FIG. 11, the rectangular boxes indicated by reference numerals 412 and 424 are only used to show general positions of the first pixel driver circuit 412 and the second pixel driver circuit 424, but do not represent their specific shapes and specific boundaries.

In the embodiments of the present disclosure, the pixel driver circuits for driving the respective sub-pixels in the second display area AA2 are located in the second display area AA2. For example, an orthographic projection of a second light-emitting device 42 on the base substrate 1 at least partially overlaps with an orthographic projection of a second pixel driver circuit 424 on the base substrate 1. This may facilitate an electrical connection between each light-emitting device 42 in the second display area AA2 and a corresponding second pixel driver circuit 424.

Figure 12:
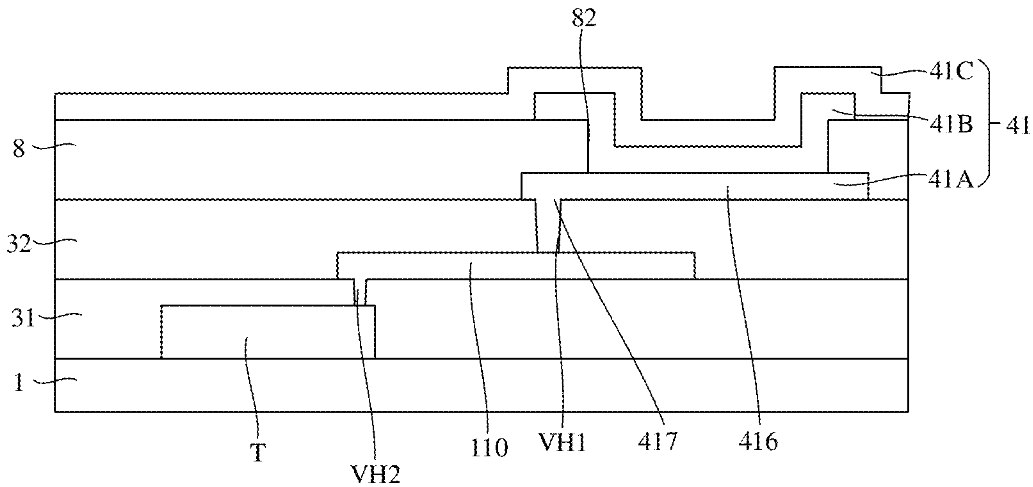
FIG. 12 shows a schematic sectional view taken along a line BB' in FIG. 11.

FIG. 12 shows a schematic sectional view taken along a line BB' in FIG. 11. Referring to FIG. 12, the display substrate 10 includes pixel driver circuit structure layers sequentially stacked on the base substrate 1, where the pixel driver circuit structure layers may include a thin film transistor T, an insulating layer 31, the first connection line 110, a planarization layer 32, and the first light-emitting device 41. The first light-emitting device 41 includes an anode structure 41A, a cathode structure 41C, and a light-emitting structure 41B between the anode structure 41A and the cathode structure 41C. The anode structure 41A of the first light-emitting device 41 is electrically connected with the first connection line 110 through a first via hole VH1 penetrating the planarization layer 32. The pixel driver circuit structure layers may include a semiconductor layer, a first insulating layer, a first gate layer, a second insulating layer, a second gate layer, an interlayer insulating layer, a source and drain metal layer, and the like. In some embodiments, the pixel driver circuit may include 7 thin film transistors (e.g., a driver transistor, a data writing transistor, a compensation transistor, a reset transistor, a light-emitting control transistor, etc.) and a storage capacitor, where at least one thin film transistor, e.g., the light-emitting control transistor is in direct connection with the light-emitting device. FIG. 12 only schematically shows a thin film transistor T (e.g., the light-emitting control transistor). The thin film transistor T includes at least an active layer, a source contact portion, and a drain contact portion that are located in the semiconductor layer, a gate located in a first gate layer, a source and a drain that are located in the source and drain metal layer. The first connection line 110 in FIG. 12 is, for example, electrically connected with a drain of the light-emitting control transistor located in the source and drain metal layer.

It will be noted that, herein, unless otherwise specified, a "via hole" is used to electrically connect portions disposed in different electrically conductive layers, and in the embodiments of the present disclosure, the "via hole" may have other alternative forms, for example, the via hole may be replaced by a "groove" to electrically connect portions disposed in different electrically conductive layers.

For example, the anode structure 41A may include a transparent conductive material such as ITO. The embodiments of the present disclosure do not limit a specific material of the anode structure 41A. For example, the cathode structure 41C may be a structure formed on an entire surface of the display substrate 10 (e.g., at least completely cover the entire display area), and the cathode structure 41C may include, for example, lithium (Li), aluminum (Al), magnesium (Mg), silver (Ag), and other metal materials. For example, the cathode structure 41C may have a good light transmittance, since the cathode structure 41C may be formed as a very thin layer.

Referring to FIG. 10 and FIG. 12, the orthographic projection of the anode structure 41A on the base substrate 1 has a shape of a circle. The orthographic projection of the anode structure 41A on the base substrate 1 covers an orthographic projection of the via hole VH1 on the base substrate 1.

Referring to FIG. 10, the plurality of first connection lines 110 are located in the first display area AA1. For example, each of the first connection lines 110 extends along the first direction X. At least some of the plurality of first connection lines 110 are dummy lines, which are shown as some disconnected connection lines in FIG. 10, and these connection lines do not electrically connected with any light-emitting device.

For example, the first connection wire 110 may include a transparent conductive material such as ITO, such that the first connection wire 110 also has a good light transmittance.

Figure 13:
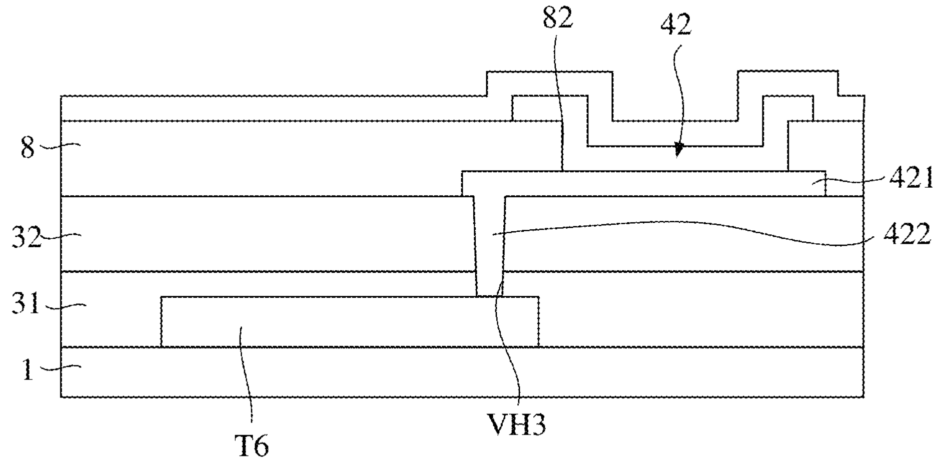
FIG. 13 shows a schematic sectional view taken along a line CC' in FIG. 11.
Figure 14:
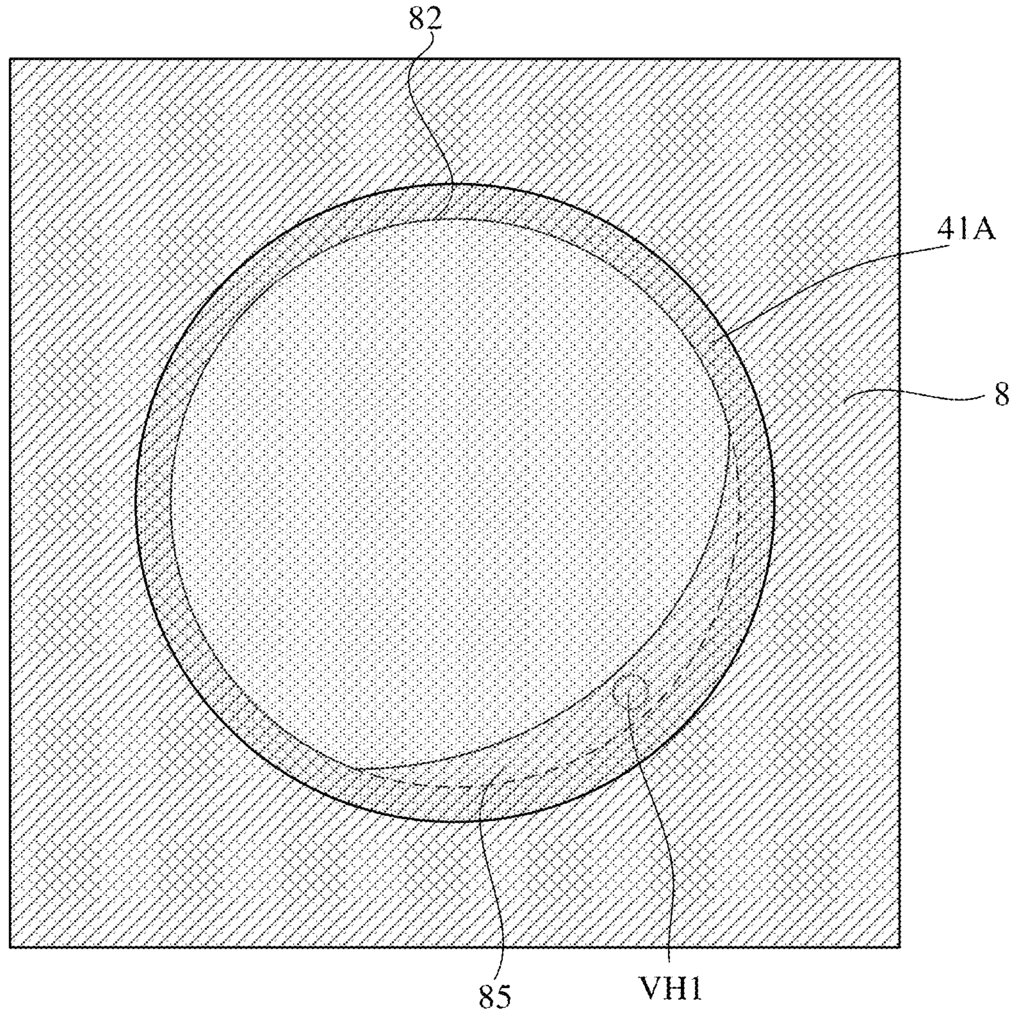
FIG. 14 shows a schematic plan structural view schematically showing an anode structure and a pixel opening of a sub-pixel in the first display area.
Figure 15:
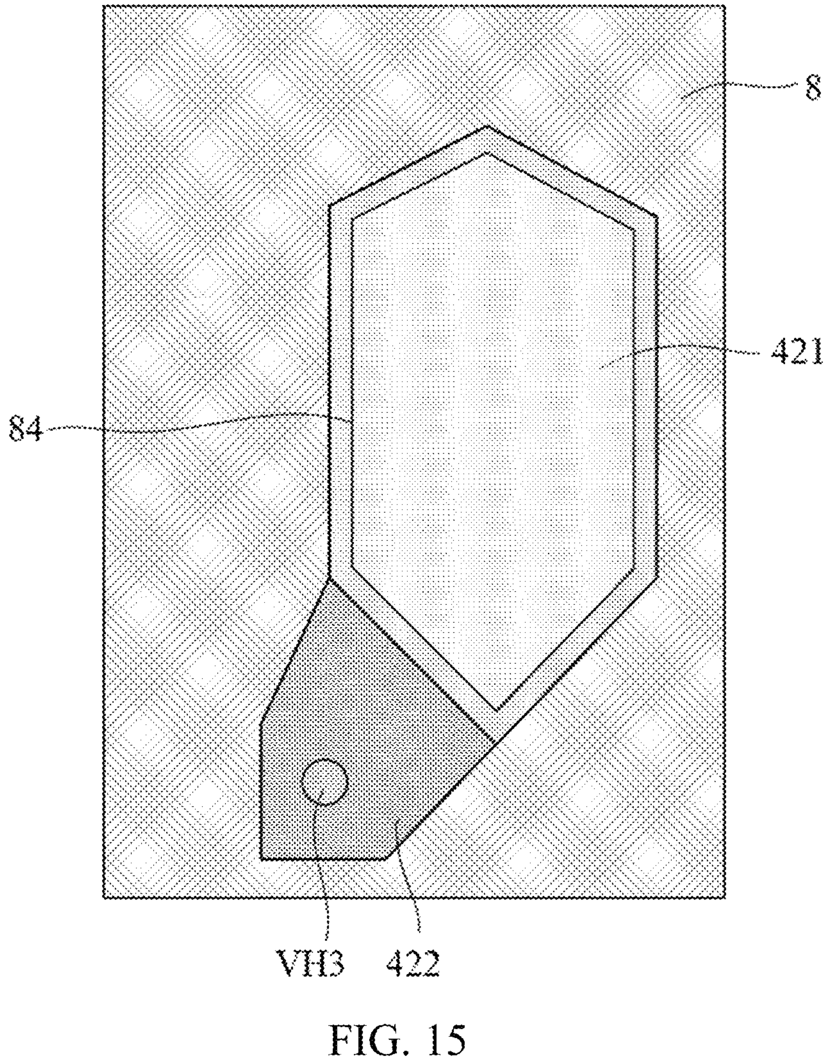
FIG. 15 shows a schematic plan structural view schematically showing an anode structure and a pixel opening of a sub-pixel in the second display area.

FIG. 13 shows a schematic sectional view taken along a line CC' in FIG. 11. FIG. 14 shows a schematic plan structural view schematically showing an anode structure and a pixel opening of a sub-pixel in the first display area. FIG. 15 shows a schematic plan structural view schematically showing an anode structure and a pixel opening of a sub-pixel in the second display area.

Referring to FIG. 11 to FIG. 15, the display substrate 10 may further include a pixel defining layer 8. For example, the pixel defining layer 8 may have a plurality of first openings 82 and a plurality of second openings 84. The plurality of first openings 82 are located in the first display area AA1, and each of the first openings 82 exposes part of the anode structure of the first light-emitting device 41. The plurality of second openings 84 are located in the second display area AA2, and each of the second openings 84 exposes part of the anode structure of the second light-emitting device 42, for example, at least part of the anode main body 421 of the second light-emitting device 42.

In the embodiments of the present disclosure, a part of the light-emitting structure 41B is filled in the first opening 82, so as to be in contact with the exposed part of the anode structure 41A. An actual area of the light-emitting region of each sub-pixel is determined by an area of the part of the light-emitting structure 41B that is in contact with the anode structure 41A, namely by an area of the opening 82 of the pixel defining layer 8.

In the embodiments of the present disclosure, an orthographic projection of the first opening 82 on the base substrate 1 may have a shape of a circle or an oval. In this way, the area of the light-emitting region of the sub-pixel may be increased, thereby improving the service life of the light-emitting devices in the first display area AA1.

Referring to FIG. 14, the orthographic projection of the first opening 82 on the base substrate 1 falls within the orthographic projection of the anode structure of the first light-emitting device 41 on the base substrate 1, and an area of the orthographic projection of the first opening 82 on the base substrate 1 is smaller than an area of the orthographic projection of the anode structure of the first light-emitting device 41 on the base substrate 1.

As described above, the orthographic projection of the anode structure of the first light-emitting device 41 on the base substrate 1 may be substantially circular or oval. In the first display area AA1, the pixel defining layer 8 includes a first protruding portion 85, and an orthographic projection of the first protruding portion 85 on the base substrate 1 covers an orthographic projection of a first via hole or first groove VH1 on the base substrate 1.

It will be noted that since the pixel defining layer 8 needs to cover the first via hole or first groove VH1, the first opening 82 of the pixel defining layer 8 does not expose the first via hole or the first groove VH1. In this way, at a position over the first via hole or first groove VH1, the pixel defining layer 8 protrudes toward the first opening 82, so that the first protruding portion 85 is formed.

As shown in FIG. 14, an orthographic projection of a combination of the first protruding portion 85 and the first opening 82 on the base substrate 1 is circular or oval, the orthographic projection of the combination of the first protruding portion 85 and the first opening 82 on the base substrate 1 falls within the orthographic projection of the anode structure of the first light-emitting device 41 on the base substrate 1, and the orthographic projection of the combination of the first protruding portion 85 and the first opening 82 on the base substrate 1 has the same center as the orthographic projection of the anode structure of the first light-emitting device 41 on the base substrate 1. For example, in the case that the orthographic projection of the anode structure of the first light-emitting device 41 on the base substrate 1 substantially has a shape of a circle, the orthographic projection of the combination of the first protruding portion 85 and the first opening 82 on the base substrate 1 substantially forms a shape of a circle as well, where the two circles are concentric circles, and a radius of the orthographic projection of the anode structure of the first light-emitting device 41 on the base substrate 1 is larger than a radius of the orthographic projection of the combination of the first protruding portion 85 and the first opening 82 on the base substrate 1.

In an embodiment of the present disclosure, the anode structure of the first light-emitting device 41 includes a center portion 416, and a periphery portion 417 surrounding the center portion, and at least part of the periphery portion 417 has a thickness different from a thickness of the center portion 416.

It will be noted that, herein, the center portion of the anode structure may include a part of the anode structure. A center of the part of the anode structure is the center of the anode structure and a radius of the part of the anode structure is ¼ of the radius of the anode structure. For example, in the case that the orthographic projection of the anode structure of the first light-emitting device 41 on the base substrate 1 substantially has a shape of a circle, an orthographic projection of the center portion of the anode structure on the base substrate 1 substantially has a shape of a circle as well, where the two circles are concentric circles, and a radius of the orthographic projection of the center portion of the anode structure on the base substrate 1 is approximately ¼ of the radius of the orthographic projection of the anode structure of the first light-emitting device 41 on the base substrate 1.

The periphery portion 417 may include a first part, an orthographic projection of the first part on the base substrate 1 covers the orthographic projection of the first via hole or first groove VH1 on the base substrate 1. In other words, the first part is a part of the anode structure of the first light-emitting device 41 at the first via hole or first groove VH1. At the first via hole or first groove VH1, the anode structure of the first light-emitting device 41 is connected to a conductive layer below, and thus a thickness of the first part of the periphery portion 417 is greater than a thickness of the center portion 416.

Similarly, an anode structure of the second light-emitting device 42 includes an anode main body 421 and an anode connection portion 422, and at least part of the anode connection portion 422 has a thickness different from a thickness of the anode main body 421.

At the via hole VH3, the anode connection portion 422 of the second light-emitting device 42 is connected to a source or a drain of the thin film transistor (which will be described in more detail below) below, and thus at least a part of the anode connection portion 422 has a thickness larger than the thickness of the anode main body 421.

In the embodiments of the present disclosure, the anode structure of the first light-emitting device 41 is connected to the conductive layer below, and the conductive layer is connected to the source or the drain of a thin film transistor below; while the anode connection portion 422 of the second light-emitting device 42 is connected to the source or the drain of a thin film transistor below. In this way, the thickness of the first part of the anode structure of the first light-emitting device 41 is smaller than a thickness of the anode connection portion 422 of the anode structure of the second light-emitting device 42.

In an embodiment of the present disclosure, an area of an orthographic projection of an anode structure in a sub-pixel in the first repeating unit P1 on the base substrate 1 is larger than an area of an orthographic projection of an anode structure in a sub-pixel of a same color in the second repeating unit P2 on the base substrate 1. For example, an area of an orthographic projection of an anode structure in a red sub-pixel in the first repeating unit P1 on the base substrate 1 is larger than an area of an orthographic projection of an anode structure in a red sub-pixel in the second repeating unit P2 on the base substrate 1. For another example, an area of an orthographic projection of an anode structure in a blue sub-pixel in the first repeating unit P1 on the base substrate 1 is larger than an area of an orthographic projection of an anode structure in a blue sub-pixel in the second repeating unit P2 on the base substrate 1. For yet another example, an area of an orthographic projection of an anode structure in a green sub-pixel in the first repeating unit P1 on the base substrate 1 is larger than an area of an orthographic projection of an anode structure in a green sub-pixel in the second repeating unit P2 on the base substrate 1.

In an embodiment of the present disclosure, an area of an orthographic projection of a first opening 82 in a sub-pixel in the first repeating unit P1 on the base substrate 1 is larger than an area of an orthographic projection of a second opening 84 in a sub-pixel of a same color in the second repeating unit P2 on the base substrate 1. For example, an area of an orthographic projection of a first opening 82 in a red sub-pixel in the first repeating unit P1 on the base substrate 1 is larger than an area of an orthographic projection of a second opening 84 in a red sub-pixel in the second repeating unit P2 on the base substrate 1. For another example, an area of an orthographic projection of a first opening 82 in a green sub-pixel in the first repeating unit P1 on the base substrate 1 is larger than an area of an orthographic projection of a second opening 84 in a green sub-pixel in the second repeating unit P2 on the base substrate 1. For yet another example, an area of an orthographic projection of a first opening 82 in a blue sub-pixel in the first repeating unit P1 on the base substrate 1 is larger than an area of an orthographic projection of a second opening 84 in a blue sub-pixel in the second repeating unit P2 on the base substrate 1.

In some embodiments, a size of an orthographic projection of a first opening 82 in a sub-pixel in the first repeating unit P1 on the base substrate 1 along the second direction Y is larger than a size of an orthographic projection of a second opening 84 in a sub-pixel of a same color in the second repeating unit P2 on the base substrate along the second direction. For example, a size of an orthographic projection of a first opening 82 in a red sub-pixel in the first repeating unit P1 on the base substrate 1 along the second direction Y is larger than a size of an orthographic projection of a second opening 84 in a red sub-pixel in the second repeating unit P2 on the base substrate along the second direction. Similarly, a blue sub-pixel and a green sub-pixel may also be set in the same way, which will not be repeated here.

Figure 16:
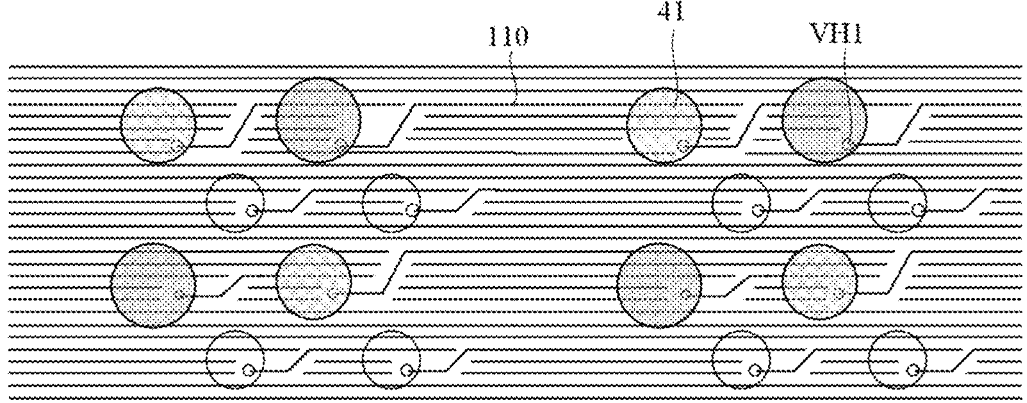
FIG. 16 shows an enlarged view of the local region REG1' in FIG. 3 according to some other embodiments of the present disclosure, where a wire for electrically connecting each sub-pixel in the first display area AA1 to a pixel driver circuit of the sub-pixel is schematically shown.

FIG. 16 shows an enlarged view of the local region REG1' in FIG. 3 according to some other embodiments of the present disclosure, where a wire for electrically connecting each sub-pixel in the first display area AA1 to a pixel driver circuit of the sub-pixel is schematically shown. In some embodiments of the present disclosure, in each of the first repeating units P1, an orthographic projection of a first via hole or first groove VH1 in each sub-pixel on the base substrate 1 are located in a same orientation with respect to a center of the orthographic projection of the anode structure of the sub-pixel on the base substrate 1. For example, in an embodiment as shown in FIG. 20, with respect to the center of the anode structure (i.e., the center of the circle), the orthographic projection of the first via hole or first groove VH1 in each sub-pixel on the base substrate 1 is located in a lower right side of the center of the anode structure.

It will be noted that the "orientation" here may be understood as a relative positional relation of an orthographic projection of a portion (e.g., a via hole or a groove) on the base substrate with respect to the orthographic projection of the center of the anode structure on the base substrate 1 in the first direction X and the second direction Y.

With continued reference to FIG. 16, in each of the first repeating units P1, the first via holes or first grooves VH1 in respective sub-pixels in the same row are located on a same straight line along the first direction X. Such an arrangement is beneficial to form the via holes or grooves through a patterning process during a manufacturing process an array substrate.

Figure 17:
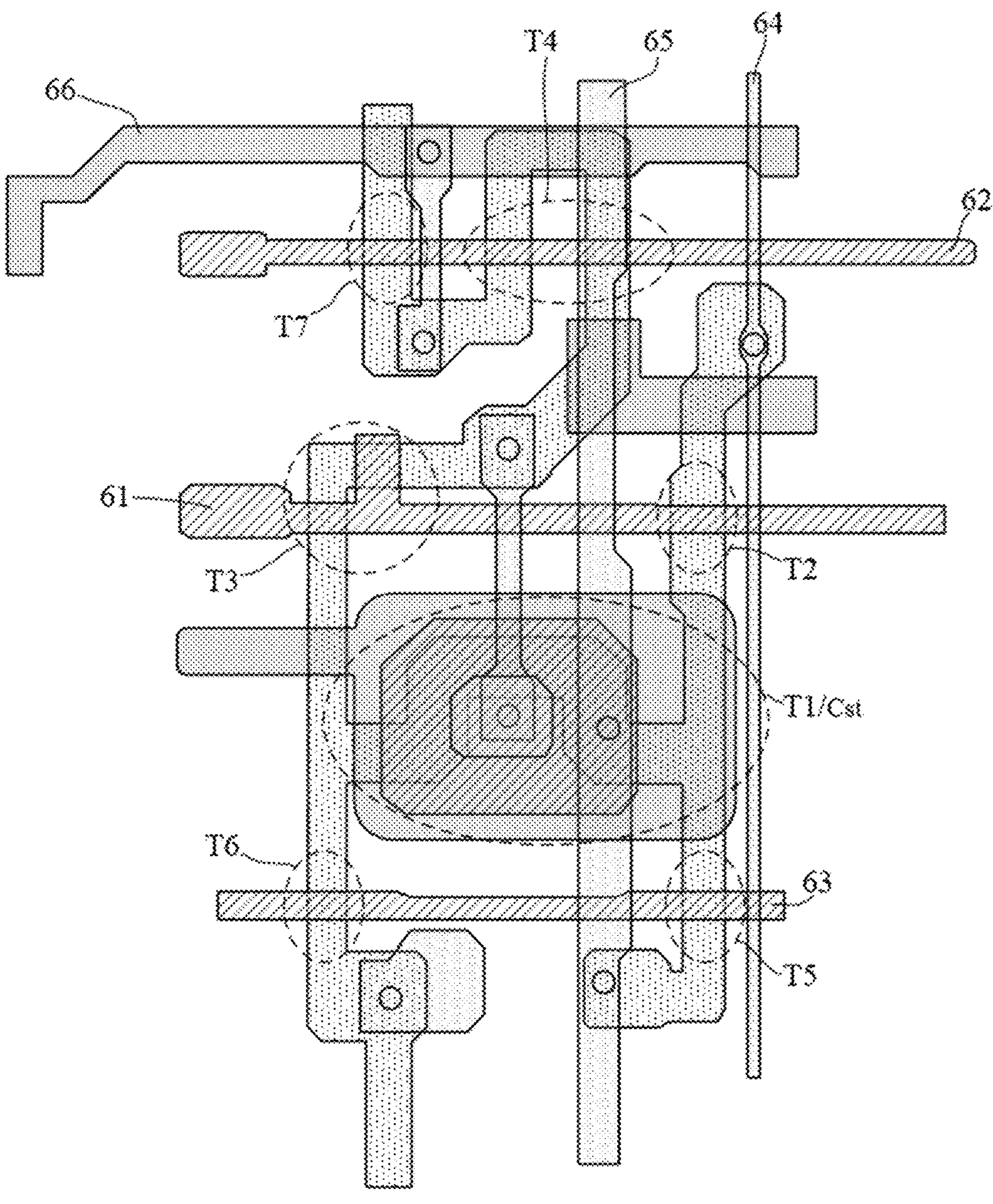
FIG. 17 shows a schematic plan view of a pixel driver circuit of a display substrate according to some exemplary embodiments of the present disclosure.
Figure 18:
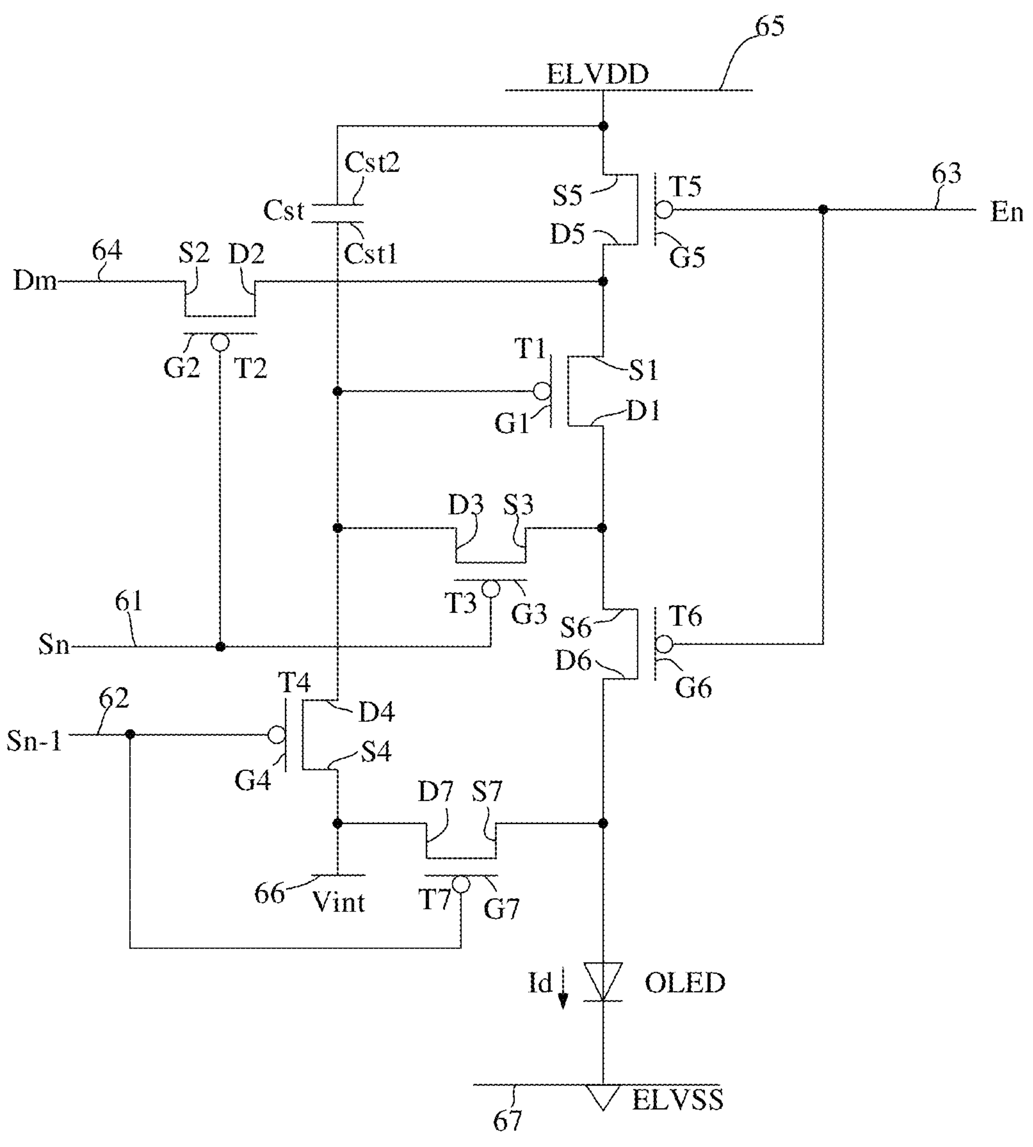
FIG. 18 shows an equivalent circuit diagram of a pixel driver circuit of a display substrate according to some exemplary embodiments of the present disclosure.

FIG. 17 shows a schematic plan view of a pixel driver circuit of a display substrate according to some exemplary embodiments of the present disclosure. FIG. 18 shows an equivalent circuit diagram of a pixel driver circuit of a display substrate according to some exemplary embodiments of the present disclosure.

A structure of the pixel driver circuit is described in detail below, taking a 7T1C pixel driver circuit as an example. However, the embodiments of the present disclosure are not limited to the 7T1C pixel driver circuit, and other known pixel driver circuit structures may be applied to the embodiments of the present disclosure without conflict.

As shown in FIG. 17 and FIG. 18, the pixel driver circuit may include: a plurality of thin film transistors and a storage capacitor Cst. The pixel driver circuit is configured to drive an organic light emitting diode (i.e., OLED). The plurality of thin film transistors include a first transistor T1, a second transistor T2, a third transistor T3, a fourth transistor T4, a fifth transistor T5, a sixth transistor T6, and a seventh transistor T7. Each transistor includes a gate, a source, and a drain.

The display substrate may further include a plurality of signal lines. For example, the plurality of signal lines include: a scan signal line 61 for transmitting a scan signal Sn, a reset signal line 62 for transmitting a reset control signal RESET (i.e., a scan signal of a previous row), a light-emitting control line 63 for transmitting a light-emitting control signal En, a data line 64 for transmitting a data signal Dm, a driving voltage line 65 for transmitting a driving voltage VDD, an initialization voltage line 66 for transmitting an initialization voltage Vint, and a power supply line 67 for transmitting a VSS voltage.

A gate G1 of the first transistor T1 is electrically connected to a terminal Cst1 of the storage capacitor Cst, a source S1 of the first transistor T1 is electrically connected to the driving voltage line 65 via the fifth transistor T5, and a drain D1 of the first transistor T1 is electrically connected to an anode of the OLED via the sixth transistor T6. The first transistor T1 receives the data signal Dm according to a switching operation of the second transistor T2, so as to supply a driving current Id to the OLED.

A gate G2 of the second transistor T2 is electrically connected to the scan signal line 61, a source S2 of the second transistor T2 is electrically connected to the data line 64, and a drain D2 of the second transistor T2 is electrically connected to the driving voltage line 65 via the fifth transistor T5 and is electrically connected to the source S1 of the first transistor T1. The second transistor T2 is turned on in response to the scan signal Sn transmitted through the scan signal line 61, so as to perform a switching operation to transmit the data signal Dm that is transmitted to the data line 64 to the source S1 of the first transistor T1.

A gate G3 of the third transistor T3 is electrically connected to the scan signal line 61, a source S3 of the third transistor T3 is electrically connected to the anode of the OLED via the sixth transistor T6 and is electrically connected to the drain D1 of the first transistor T1, and a drain D3 of the third transistor T3 is electrically connected to a terminal Cst1 (i.e., a first capacitor electrode) of the storage capacitor Cst, a drain D4 of the fourth transistor T4 and the gate G1 of the first transistor T1. The third transistor T3 is turned on in response to the scan signal Sn transmitted through the scan signal line 61, so to connect the gate G1 and the drain D1 of the first transistor T1 to each other, thereby performing a diode connection of the first transistor T1.

A gate G4 of the fourth transistor T4 is electrically connected to the reset control signal line 62, a source S4 of the fourth transistor T4 is electrically connected to the initialization voltage line 66, and a drain D4 of the fourth transistor T4 is electrically connected to the terminal Cst1 of the storage capacitor Cst, the drain D3 of the third transistor T3, and the gate G1 of the first transistor T1. The fourth transistor T4 is turned on in response to the reset control signal Sn−1 transmitted through the reset control signal line 62, so as to transmit the initialization voltage Vint to the gate G1 of the first transistor T1, thereby performing an initialization operation to initialize a voltage of the gate G1 of the first transistor T1.

A gate G5 of the fifth transistor T5 is electrically connected to the light-emitting control line 63, a source S5 of the fifth transistor T5 is electrically connected to the driving voltage line 65, and a drain D5 of the fifth transistor T5 is electrically connected to the source S1 of the first transistor T1 and the drain D2 of the second transistor T2.

A gate G6 of the sixth transistor T6 is electrically connected to the light-emitting control line 63, a source S6 of the sixth transistor T6 is electrically connected to the drain D1 of the first transistor T1 and is electrically connected to the source S3 of the third transistor T3, and the drain D6 of the sixth transistor T6 is electrically connected to the anode of the OLED. The fifth transistor T5 and the sixth transistor T6 are concurrently (e.g., simultaneously) turned on in response to the light-emitting control signal En transmitted through the light-emitting control line 63, so as to transmit the drive voltage ELVDD to the OLED, thereby allowing the drive current Id to flow into the OLED.

A seventh transistor T7 includes: a gate G7 connected to the reset control signal line 62; a source S7 connected to the drain D6 of the sixth transistor T6 and the anode of the OLED; and a drain D7 connected to the initialization voltage line 66. The seventh transistor T7 transmits the reset control signal Sn−1 from the reset control signal line 62 to the gate G7.

Another terminal Cst2 of the storage capacitor Cst is electrically connected to the driving voltage line 65, and a cathode of the OLED is electrically connected to the power supply line 67, so as to receive a common voltage ELVSS. Correspondingly, the OLED receives the drive current Id from the first transistor T1 to emit light, thereby displaying an image.

It will be noted that, in FIG. 18, each of the thin film transistors T1, T2, T3, T4, T5, T6, and T7 is a p-channel field effect transistor, but the embodiments of the present disclosure are not limited to this. At least some of the thin film transistors T1, T2, T3, T4, T5, T6, and T7 may be n-channel field effect transistors.

In an operation, during an initialization stage, the reset control signal Sn−1 at a low level is supplied through the reset control signal line 62. Subsequently, the initialization thin film transistor T4 is turned on based on the low level of the reset control signal Sn−1, and the initialization voltage Vint from the initialization voltage line 66 is transmitted to the gate G1 of the driver the thin film transistor T1 through the initialization thin film transistor T4. As such, the driver thin film transistor T1 is initialized due to the initialization voltage Vint.

During a data programming stage, the scan signal Sn at a low level is supplied through the scan signal line 61. Subsequently, the switching thin film transistor T2 and the compensation thin film transistor T3 are turned on based on the low level of the scan signal Sn. Accordingly, the drive thin film transistor T1 is set to be in a diode-connection state and is biased in a positive direction through the turned-on compensation thin film transistor T3.

Subsequently, a compensation voltage (Dm+Vth) (e.g., Vth is of a negative value) obtained by subtracting a threshold voltage Vth of the driver thin film transistor T1 from the data signal Dm supplied via the data line 64 is applied to the gate G1 of the driver thin film transistor T1. Then, the driving voltage ELVDD and the compensation voltage (Dm+Vth) are applied to the two terminals of the storage capacitor Cst, so that charges corresponding to a voltage difference between the corresponding terminals are stored in the storage capacitor Cst.

During a light-emitting stage, the light-emitting control signal En from the light-emitting control line 63 changes from a high level to a low level. Subsequently, during the light-emitting stage, the first light-emitting control thin film transistor T5 and the second light-emitting control thin film transistor T6 are turned on based on the low level of the light-emitting control signal En.

Subsequently, a driving current is generated based on a difference between the voltage of the gate G1 of the driver thin film transistor T1 and the driving voltage ELVDD. The driving current Id corresponding to a difference between the driving current and a bypass current is supplied to the OLED through the second light-emitting control thin film transistor T6.

During the light-emitting stage, based on a current-voltage relationship of the driver thin film transistor T1, a gate-source voltage of the driver thin film transistor T1 is maintained at ((Dm+Vth)−ELVDD) due to the storage capacitor Cst. The driving current Id is proportional to $(Dm-ELVDD)^2$. Therefore, it is possible to protect the driving current Id from being affected by a fluctuation of the threshold voltage Vth of the driver thin film transistor T1.

For example, referring to FIG. 10 to FIG. 18, the above first pixel driver circuit 412 may adopt a circuit as shown in FIG. 17 and FIG. 18. In this case, the second end of the first connection line 110 may be electrically connected to the first pixel driver circuit 412 through a via hole VH2.

For example, the above second pixel driver circuit 424 may adopt the circuit as shown in FIG. 17 and FIG. 18. In this case, the orthographic projection of the anode structure of the sub-pixel located in the second display area AA2 on the base substrate 1 may cover the orthographic projection of a via hole VH3 (as shown in FIG. 11) on the base substrate 1. In this way, the anode structure of the sub-pixel located in the second display area AA2 is electrically connected to the second pixel driver circuit 424 through the via hole VH3.

For example, in the embodiments of the present disclosure, the base substrate 1 may be a glass substrate, a quartz substrate, a metal substrate, a resin substrate, or the like, or may be a rigid substrate or a flexible substrate, which is not limited in the embodiments of the present disclosure.

Figure 19A:
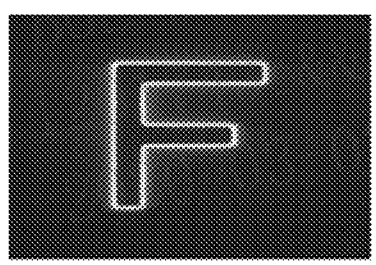
FIG. 19A to FIG. 19C respectively show an expanded diffraction simulation diagram, a PSF (point spread function) simulation diagram, and a glare real shot diagram of the first display area of the display substrate with a layout as shown in FIG. 4.
Figure 19B:
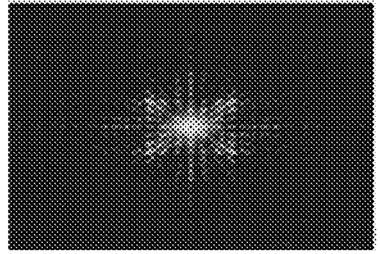
Figure 19C:
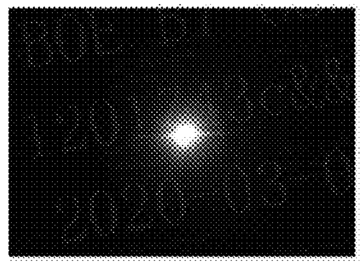
Figure 20A:
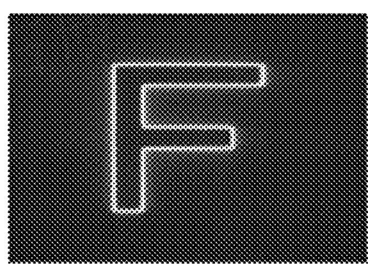
FIG. 20A to FIG. 20C respectively show an expanded diffraction simulation diagram, a PSF (point spread function) simulation diagram, and a glare real shot diagram of the first display area of the display substrate with a layout as shown in FIG. 6.
Figure 20B:
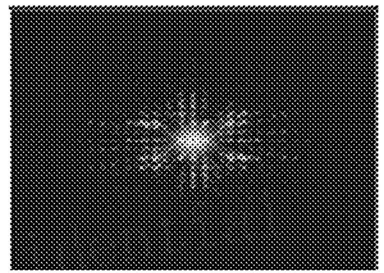
Figure 20C:
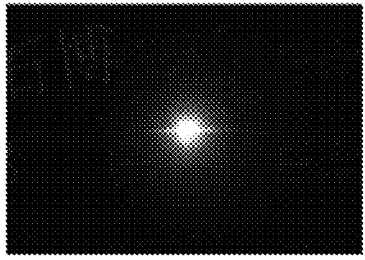
Figure 21A:
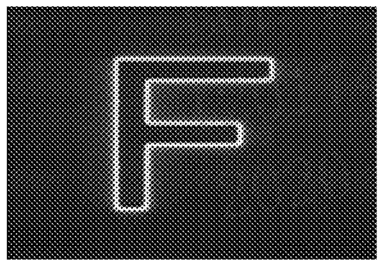
FIG. 21A to FIG. 21C respectively show an expanded diffraction simulation diagram, a PSF (point spread function) simulation diagram, and a glare real shot diagram of the first display area of the display substrate with a layout as shown in FIG. 7.
Figure 21B:
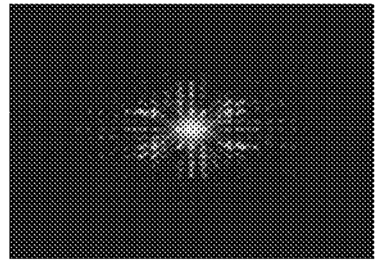
Figure 21C:
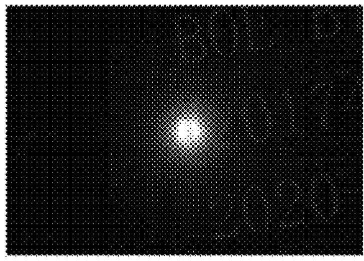

FIG. 19A to FIG. 19C respectively show an expanded diffraction simulation diagram, a PSF (point spread function) simulation diagram, and a glare real shot diagram of the first display area of the display substrate with a layout as shown in FIG. 4. FIG. 20A to FIG. 20C respectively show an expanded diffraction simulation diagram, a PSF (point spread function) simulation diagram, and a glare real shot diagram of the first display area of the display substrate with a layout as shown in FIG. 6. FIG. 21A to FIG. 21C respectively show an expanded diffraction simulation diagram, a PSF (point spread function) simulation diagram, and a glare real shot diagram of the first display area of the display substrate with a layout as shown in FIG. 7. It may be seen from FIG. 19A to FIG. 21C that in the embodiments of the present disclosure, in the first display area AA1, the anode structures of the first repeating units and the corresponding light-emitting structures are clustered compactly. Correspondingly, the spacing between the first repeating units is increased, so that the light diffraction in the first display area may be reduced and the glare problem may be improved.

Referring back to FIG. 1 and FIG. 2, according to at least some embodiments of the present disclosure, a display apparatus is further provided. The display apparatus may include the display substrate and the sensor 2 (e.g., a camera) as described above.

As described above, the display substrate has the first display area and the second display area, and the pixel density of the first display area is greater than that of the second display area. The sensor 2 is disposed on a side of the base substrate 1 away from the pixel array, with a photosensitive surface of the sensor 2 facing the display substrate. An orthographic projection of the sensor 2 on the base substrate 1 overlaps with an orthographic projection of the second display area AA2 on the base substrate 1, for example, the orthographic projection of the sensor 2 is within the orthographic projection of the second display area AA2 on the base substrate 1. In this way, light passing through the second display area may be used for imaging, thereby realizing a function of an under-screen camera.

The sensor 2 may adopt a structure known in the art, such as a complementary metal oxide semiconductor (CMOS) image sensor or a charge coupled device (CCD) image sensor. The sensor 2 may be electrically connected to an image processor. In addition to the image sensor, for a better imaging effect, an imaging module including the image sensor may further include, for example, a lens assembly, and the lens assembly and the image sensor may be arranged sequentially along an optical axis of the lens assembly in a direction perpendicular to the base substrate 1.

The display apparatus may include any device or product having a display function. For example, the display apparatus may be a smartphone, a mobile phone, an e-book reader, a desktop computer (PC), a laptop PC, a netbook PC, a personal digital assistant (PDA), a portable multimedia player (PMP), a digital audio player, a mobile medical device, a camera, a wearable device (such as a head-mounted device, an electronic clothing, an electronic wristband, an electronic necklace, an electronic accessory, an electronic tattoo, and a smart watch), a TV set, etc.

Some embodiments of the general technical concept of the present disclosure have been shown and described, those of ordinary skill in the art will understand that modifications may be made to these embodiments without departing from the principle and spirit of the general technical concept, and the scope of the present disclosure is defined by the claims and the equivalents thereof.

What is claimed is:

1. A display substrate, comprising a first display area and a second display area, wherein the display substrate comprises:

a base substrate;

a plurality of first repeating units, arranged on the base substrate in an array along a first direction and a second direction, and located in the first display area, each of the first repeating units comprising a plurality of sub-pixels that comprise: a first sub-pixel and a second sub-pixel that are alternately arranged in each of the first direction and the second direction, and a plurality of third sub-pixels arranged in an array along the first direction and the second direction; and a plurality of second repeating units, arranged on the base substrate in an array along the first direction and the second direction, and located in the second display area, each of the second repeating units comprising a plurality of sub-pixels, wherein the first repeating unit has a first pitch equal to a distance, along the first direction, between centers of two first sub-pixels that are respectively located in two adjacent first repeating units and are located in a same row;

the second repeating unit has a second pitch equal to a distance, along the first direction, between centers of two first sub-pixels that are respectively located in two adjacent second repeating units and are located in a same row, the first pitch being greater than the second pitch; and within one of the first repeating units, a distance between centers of two adjacent sub-pixels along the first direction is a first distance, and the first distance and the second pitch are in a following relationship: 0.3×the second pitch≤the first distance≤0.8×the second pitch; and wherein in two adjacent first repeating units along the first direction, a distance, along the first direction, between centers of two sub-pixels that are respectively located in the two first repeating units and are adjacent to each other along the first direction is a first spacing; and a number of the plurality of sub-pixels within the first repeating unit is larger than a number of the plurality of sub-pixels within the second repeating unit, and the first spacing is greater than the first distance.

2. The display substrate according to claim 1, wherein the first spacing and the second pitch are in a following relationship: 1.2×the second pitch≤the first spacing≤1.7×the second pitch.

3. The display substrate according to claim 2, wherein in two adjacent first repeating units along the second direction, a distance, along the second direction, between two sub-pixels that are respectively located in two first repeating units and are adjacent to each other along the second direction is a second spacing, and a ratio of the second spacing to the first spacing is between 0.8 and 1.2.

4. The display substrate according to claim 2, wherein the first distance is in a range of 36.12 microns to 96.32 microns; and/or, the first spacing is in a range of 144.48 microns to 204.68 microns.

5. The display substrate according to claim 1, wherein in one of the first repeating units, a distance between centers of two adjacent sub-pixels along the second direction is a second distance, and a ratio of the second distance to the first distance is between 0.8 and 1.2.

6. A display apparatus, comprising a display substrate according to claim 1, and a sensor, wherein the display substrate has a first side configured to perform displaying, and a second side opposite to the first side, wherein the first display area allows light from the first side to be at least partially transmitted to the second side;

the sensor is disposed on the second side of the display substrate, and is configured to receive light from the first side; and an orthographic projection of the sensor on the display substrate at least partially overlaps with the first display area.

7. The display substrate according to claim 1, wherein the plurality of sub-pixels that are comprised in the first repeating unit comprise a first light-emitting device, and the first light-emitting device comprises at least an anode structure, wherein an orthographic projection of the anode structure on the base substrate has a shape of a circle or an oval, or the anode structure comprises an anode main body and an anode connection portion, an orthographic projection of the anode main body on the base substrate having a shape of a circle or an oval.

8. The display substrate according to claim 7, wherein the display substrate further comprises a third display area at least partially surrounding the first display area, and the second display area at least partially surrounds the third display area; and the display substrate comprises a first pixel driver circuit located in the third display area; and the display substrate further comprises at least one first connection line comprising a first end located in the first display area and a second end located in the third display area, wherein the first end of the first connection line is electrically connected with the anode structure of the first light-emitting device, the second end of the first connection line is electrically connected with the first pixel driver circuit, and the first connection line is configured to transmit an electrical signal provided by the first pixel driver circuit to the anode structure of the first light-emitting device.

9. The display substrate according to claim 8, wherein the first end of the first connection line is electrically connected with the anode structure of the first light-emitting device through a first via hole or a first groove, and an orthographic projection of the anode structure of the first light-emitting device on the base substrate covers an orthographic projection of the first via hole or the first groove on the base substrate.

10. The display substrate according to claim 9, wherein the display substrate comprises a pixel defining layer disposed on the base substrate, wherein the pixel defining layer has a first opening exposing a part of the anode structure of the first light-emitting device, an orthographic projection of the first opening on the base substrate falls within the orthographic projection of the anode structure of the first light-emitting device on the base substrate, and an area of the orthographic projection of the first opening on the base substrate is smaller than an area of the orthographic projection of the anode structure of the first light-emitting device on the base substrate; and wherein the pixel defining layer comprises a first protruding portion, and an orthographic projection of the first protruding portion on the base substrate covers the orthographic projection of the first via hole or the first groove on the base substrate.

11. The display substrate according to claim 10, wherein an orthographic projection of a combination of the first protruding portion and the first opening on the base substrate has a shape of a circle or an oval, the orthographic projection of the combination of the first protruding portion and the first opening on the base substrate falls within the orthographic projection of the anode structure of the first light-emitting device on the base substrate, and the orthographic projection of the combination of the first protruding portion and the first opening on the base substrate has a same center as the orthographic projection of the anode structure of the first light-emitting device on the base substrate.

12. The display substrate according to claim 10 wherein the anode structure of the first light-emitting device comprises a center portion and a periphery portion surrounding the center portion, at least a part of the periphery portion having a thickness different from a thickness of the center portion; and wherein the periphery portion comprises a first part, an orthographic projection of the first part on the base substrate covering the orthographic projection of the first via hole or the first groove on the base substrate, and the first part of the periphery portion having a thickness greater than the thickness of the center portion.

13. The display substrate according to claim 10, wherein each of the plurality of sub-pixels comprised in the second repeating unit comprises a second light-emitting device, and the second light-emitting device comprises at least an anode structure; the pixel defining layer further has a second opening exposing at least a part of the anode structure of the second light-emitting device;

an area of an orthographic projection of a first opening in a sub-pixel in the first repeating unit on the base substrate is greater than an area of an orthographic projection of a second opening in a sub-pixel of a same color in the second repeating unit on the base substrate; and a size of an orthographic projection of a first opening in a sub-pixel in the first repeating unit on the base substrate along the first direction is larger than a size of an orthographic projection of a second opening in a sub-pixel of a same color in the second repeating unit on the base substrate along the first direction.

14. The display substrate according to claim 13, wherein an area of an orthographic projection of an anode structure in a sub-pixel in the first repeating unit on the base substrate is larger than an area of an orthographic projection of an anode structure in a sub-pixel of a same color in the second repeating unit on the base substrate.

15. The display substrate according to claim 13, wherein the display substrate further comprises a second pixel driver circuit located in the second display area, an anode structure of a second light-emitting device is electrically connected with the second pixel driver circuit through a second via hole or a second groove; and the anode structure of the second light-emitting device comprises an anode connection portion, wherein an orthographic projection of the anode connection portion on the base substrate covers an orthographic projection of the second via hole or the second groove on the base substrate, and a thickness of a first part of the anode structure of the first light-emitting device is smaller than a thickness of the anode connection portion of the anode structure of the second light-emitting device.

16. The display substrate according to claim 10, wherein in each of the first repeating units, an orthographic projection of a first via hole or a first groove in each sub-pixel on the base substrate is located in a same orientation with respect to a center of an orthographic projection of an anode structure of the sub-pixel on the base substrate; and wherein in each of the first repeating units, first via holes or first grooves in respective sub-pixels located in a same row are located on a same straight line along the first direction.

17. The display substrate according to claim 9, wherein in the first display area, the first connection line is on a side of the anode structure proximate to the base substrate;

the display substrate further comprises a planarization layer between a layer where the first connection line is located and a layer where the anode structure is located, and the first via hole or the first groove is in the planarization layer; and the anode structure is electrically connected with the first connection line through the first via hole or the first groove.

18. The display substrate according to claim 7, wherein one of the first repeating units comprises at least one first sub-pixel, at least one second sub-pixel, and at least one third sub-pixel, wherein the first sub-pixel is configured to emit light of a first color, the second sub-pixel is configured to emit light of a second color, and the third sub-pixel is configured to emit light of a third color, the first color, the second color, and the third color being different from one another; and orthographic projections of anode structures of first light-emitting devices comprised in the first sub-pixel, the second sub-pixel, and the third sub-pixel on the base substrate have a shape of a circle; or the orthographic projections of the anode structures of the first light-emitting devices comprised in the first sub-pixel, the second sub-pixel, and the third sub-pixel on the base substrate have a shape of an oval; or orthographic projections of anode structures of first light-emitting devices comprised in one or more of the first sub-pixel, the second sub-pixel, and the third sub-pixel on the base substrate have a shape of a circle, and orthographic projections of anode structures of first light-emitting devices comprised in another one or more of the first sub-pixel, the second sub-pixel, and the third sub-pixel on the base substrate have a shape of an oval.

19. The display substrate according to claim 7, wherein a plurality of sub-pixels comprised in one of the first repeating units are arranged in an array of 4 rows and 4 columns;

in a first row, a first sub-pixel and a third sub-pixel are respectively located in a first column and a second column; in a second row, a third sub-pixel and a second sub-pixel are respectively located in a third column and a fourth column; in a third row, a third sub-pixel and a second sub-pixel are respectively located in the first column and the second column; and in a fourth row, a first sub-pixel and a third sub-pixel are respectively located in the third column and the fourth column; or in a first row, a first sub-pixel and a second sub-pixel are respectively located in a first column and a third column; in a second row, two third sub-pixels are respectively located in a second column and a fourth column; in a third row, a second sub-pixel and a first sub-pixel are respectively located in the first column and the third column; and in the fourth row, two third sub-pixels are respectively located in the second column and the fourth column.

20. The display substrate according to claim 19, wherein an orthographic projection of an anode structure of a first light-emitting device comprised in the first sub-pixel on the base substrate has a shape of a circle, and an orthographic projection of an anode structure of a first light-emitting device comprised in each of the second sub-pixel and the third sub-pixel on the base substrate has a shape of an oval; and a long axis of the anode structure of the each of the second sub-pixel and the third sub-pixel substantially extends along the second direction.

* * * * *